of a circuit in contact

(12) United States Patent
Morita et al.

(10) Patent No.: US 10,448,510 B2
(45) Date of Patent: Oct. 15, 2019

(54) MULTILAYER SUBSTRATE AND ELECTRONIC DEVICE

(71) Applicant: Murata Manufacturing Co., Ltd., Nagaokakyo-shi, Kyoto-fu (JP)

(72) Inventors: Isamu Morita, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/881,858

(22) Filed: Jan. 29, 2018

(65) Prior Publication Data
US 2018/0153037 A1 May 31, 2018

Related U.S. Application Data

(63) Continuation of application No. PCT/JP2016/073534, filed on Aug. 10, 2016.

(30) Foreign Application Priority Data

Aug. 18, 2015 (JP) .................................. 2015-161348
Jun. 30, 2016 (JP) .................................. 2016-130430

(51) Int. Cl.
*H01Q 23/00* (2006.01)
*H01Q 1/38* (2006.01)
(Continued)

(52) U.S. Cl.
CPC ............... *H05K 1/115* (2013.01); *H01Q 1/38* (2013.01); *H01Q 1/40* (2013.01); *H01Q 23/00* (2013.01);
(Continued)

(58) Field of Classification Search
CPC .. H01Q 1/38; H01Q 1/40; H01Q 9/42; H01Q 23/00; H05K 1/02; H05K 1/115;
(Continued)

(56) References Cited

U.S. PATENT DOCUMENTS

2004/0040739 A1 3/2004 Yoshimura et al.
2007/0096992 A1 5/2007 Fujii
(Continued)

FOREIGN PATENT DOCUMENTS

JP 02-224398 A 9/1990
JP 2001-326433 A 11/2001
(Continued)

OTHER PUBLICATIONS

Official Communication issued in International Patent Application No. PCT/JP2016/073534, dated Oct. 25, 2016.
(Continued)

*Primary Examiner* — Hoang V Nguyen
(74) *Attorney, Agent, or Firm* — Keating & Bennett, LLP

(57) ABSTRACT

A multilayer substrate includes a base in which insulating base material layers including a thermoplastic resin are stacked, a conductor provided on at least one of the insulating base material layers, a ground electrode and a ground conductor, and a metal member connected to the conductor. The metal member is disposed inside the base and includes a portion extending in at least a stacking direction of the insulating base material layers and a portion extending in a planar direction parallel or substantially parallel to a principal surface of the insulating base material layers, and the metal member defines at least a portion of a circuit in contact with the base.

18 Claims, 25 Drawing Sheets

(51) Int. Cl.
*H05K 1/11* (2006.01)
*H01R 24/50* (2011.01)
*H05K 1/02* (2006.01)
*H05K 1/03* (2006.01)
*H05K 1/14* (2006.01)
*H05K 1/18* (2006.01)
*H05K 3/02* (2006.01)
*H05K 3/46* (2006.01)
*H01Q 1/40* (2006.01)
*H01R 103/00* (2006.01)
*H05K 3/40* (2006.01)
*H05K 5/04* (2006.01)
*H01Q 9/42* (2006.01)

(52) U.S. Cl.
CPC ........... *H01R 24/50* (2013.01); *H05K 1/0242* (2013.01); *H05K 1/032* (2013.01); *H05K 1/144* (2013.01); *H05K 1/181* (2013.01); *H05K 1/182* (2013.01); *H05K 3/027* (2013.01); *H05K 3/4697* (2013.01); *H01Q 9/42* (2013.01); *H01R 2103/00* (2013.01); *H05K 1/188* (2013.01); *H05K 3/4069* (2013.01); *H05K 3/4617* (2013.01); *H05K 3/4652* (2013.01); *H05K 5/04* (2013.01); *H05K 2201/0129* (2013.01); *H05K 2201/1003* (2013.01); *H05K 2201/10015* (2013.01); *H05K 2201/10098* (2013.01)

(58) Field of Classification Search
CPC ........ H05K 1/144; H05K 1/181; H05K 1/182; H05K 3/027; H05K 3/4069; H05K 3/4652; H05K 3/4697
See application file for complete search history.

(56) References Cited

U.S. PATENT DOCUMENTS

2010/0314041 A1* 12/2010 Ng .......................... H05K 3/101
  156/278
2011/0248890 A1* 10/2011 Lee ....................... H01Q 1/2283
  343/700 MS
2012/0187198 A1* 7/2012 Kato ................. G06K 19/07771
  235/492

FOREIGN PATENT DOCUMENTS

| | | |
|---|---|---|
| JP | 2007-124328 A | 5/2007 |
| JP | 2008-108864 A | 5/2008 |
| JP | 2014-146650 A | 8/2014 |
| JP | 2015-088595 A | 5/2015 |
| WO | 2014/152884 A1 | 9/2014 |

OTHER PUBLICATIONS

Official Communication issued in Japanese Patent Application No. 2017-535505, dated Oct. 23, 2018.

* cited by examiner

MULTILAYER SUBSTRATE AND ELECTRONIC DEVICE

CROSS REFERENCE TO RELATED APPLICATIONS

This application claims the benefit of priority to Japanese Patent Application No. 2015-161348 filed on Aug. 18, 2015 and Japanese Patent Application No. 2016-130430 filed on Jun. 30, 2016 and is a Continuation Application of PCT Application No. PCT/JP2016/073534 filed on Aug. 10, 2016. The entire contents of each application are hereby incorporated herein by reference.

BACKGROUND OF THE INVENTION

1. Field of the Invention

The present invention relates to a multilayer substrate and particularly relates to a multilayer substrate having, for example, a base material in which a plurality of insulating base material layers are stacked and a metal member disposed inside the base material, and an electronic device including the multilayer substrate. The present invention further relates to a method of manufacturing the multilayer substrate.

2. Description of the Related Art

Conventionally, in a multilayer substrate having a stack of a plurality of insulating base material layers, when a conductor pattern formed on principal surfaces of all or some of the insulating base material layers and an interlayer connection conductor extending in a direction perpendicular to the principal surfaces of the insulating base material layers are connected, a conductor (circuit) having a three-dimensional structure is formed in the multilayer substrate.

For example, Japanese Patent Laid-Open Publication No. 2007-124328 discloses an antenna having a three-dimensional structure and disposed inside a laminated body in which a plurality of insulating base material layers are stacked. The antenna is a conductor having a three-dimensional structure in which a feeding end of a conductor pattern of an inverted-F antenna included on principal surfaces of insulating base material layers is connected by an interlayer connection conductor such as a plated through hole or a via conductor.

However, the conductor of the three-dimensional structure disclosed in Japanese Patent Laid-Open Publication No. 2007-124328 has the following problems.

In order to connect conductor patterns formed on the respective insulating base material layers to each other with an interlayer connection conductor, such as a plated through hole and a via conductor, processes of forming a through hole in an insulating base material layer and filling a conductive member in the through hole are required, so that a manufacturing process becomes complicated.

It is necessary to take account of a stacking displacement (stacking position accuracy) of the insulating base material layers, and unnecessary portions are left in the conductor pattern, so that electrical characteristics are also affected.

When the number of stacked insulating base material layers increases, the number of interlayer connection conductors also increases, so that the conductor resistance loss of the entire conductor having a three-dimensional structure increases. In addition, as the number of connection points due to the interlayer connection conductors increases, reliability of electrical connection between the conductors decreases.

SUMMARY OF THE INVENTION

Preferred embodiments of the present invention provide multilayer substrates in each of which a conductor (circuit) of a three-dimensional structure which has a desired shape and which is able to reduce or prevent conductor resistance loss is disposed inside the multilayer substrate with a simple configuration, electronic devices including the multilayer substrates, and a method of manufacturing the multilayer substrate.

A multilayer substrate according to a preferred embodiment of the present invention includes a base in which a plurality of insulating base material layers made of a thermoplastic resin are stacked; a conductor pattern provided on at least one of the insulating base material layers; and a metal member including a bent portion provided inside the base and being connected to the conductor pattern.

In this multilayer substrate, the metal member is a member which includes a portion extending in at least a stacking direction of the plurality of insulating base material layers and a portion extending in a planar direction parallel or substantially parallel to a principal surface of the plurality of insulating base material layers with the bent portion interposed between the portion extending in the stacking direction and the portion extending in the planar direction. The metal member defines at least a portion of a circuit provided in contact with the base.

The conductivity of an interlayer connection conductor, such as a via conductor formed by solidifying a conductive paste, is lower than that of the metal member, so that the resistance is higher. With this configuration, a conductor (circuit) having a three-dimensional structure is able to be provided inside the base without using such an interlayer connection conductor. Thus, as compared to a case in which the conductor (circuit) having a three-dimensional structure is provided inside the base by using a large number of the interlayer connection conductors, the conductor resistance loss of the entire circuit is reduced.

Further, with this configuration, when the conductor (circuit) having a three-dimensional structure is provided inside the base, it is not necessary to provide a conductor pattern or an interlayer connection conductor within the insulating base material layers. Thus, the manufacturing process is simplified. Furthermore, with this configuration, since a metal member prepared in advance to have a three-dimensional structure is used, electrical connection reliability is high as compared to a case in which the conductor (circuit) having a three-dimensional structure is provided by the conductor pattern and the interlayer connection conductor formed by solidifying the conductive paste.

In a multilayer substrate according to a preferred embodiment of the present invention, at least a portion of the metal member provided inside the base may preferably be disposed in a cavity provided inside the stacked insulating base material layers and extending in the stacking direction and in the planar direction parallel or substantially parallel to the principal surface of the plurality of insulating base material layers so as to correspond to the shape of the metal member. With this configuration, it is possible to easily provide a multilayer substrate in which a metal member having a desired three-dimensional structure is disposed inside the base.

In a multilayer substrate according to a preferred embodiment of the present invention, a thickness of the metal member in the stacking direction may preferably be larger than a thickness of the conductor pattern in the stacking direction. With this configuration, the DCR (direct current resistance) of the metal member is reduced, and the conductor resistance loss is reduced. The strength of the metal member is increased by increasing the thickness of the metal member in the stacking direction, and deformation of the metal member during heating and pressing or due to external force or the like is further reduced or prevented.

In a multilayer substrate according to a preferred embodiment of the present invention, the multilayer substrate may preferably include an interlayer connection conductor provided in at least one of the plurality of insulating base material layers, extending in the stacking direction, and connected to the conductor pattern, and the interlayer connection conductor and the conductor pattern may preferably be solid phase diffusion bonded to each other. With this configuration, the interlayer connection conductor and the conductor pattern are bonded face to face. Thus, electrical and mechanical connection reliability of the connection between the interlayer connection conductor and the conductor pattern is high.

In a multilayer substrate according to a preferred embodiment of the present invention, the metal member may preferably be made of the same material as the conductor pattern. With this configuration, for example, when a conductive bonding material includes Sn, and the metal member and the conductor pattern include Cu, it is easy to provide a solid phase diffusion layer between Sn and Cu. Accordingly, it is preferable to match the materials of the metal member and the conductor pattern.

In a multilayer substrate according to a preferred embodiment of the present invention, a portion of the metal member may preferably extend in a direction that is greater than 0° and less than 90° with respect to the stacking direction. As compared to a case in which a conductor having a three-dimensional structure is defined by combining a portion extending in the stacking direction and a portion extending in the planar direction parallel or substantially parallel to the principal surface of the insulating base material layer, the length of the entire conductor is able to be further shortened by including a portion extending at an acute angle with respect to the stacking direction. Accordingly, with this configuration, it is possible to shorten a conductor length of the entire metal member and to further reduce the conductor resistance loss.

In a multilayer substrate according to a preferred embodiment of the present invention, the metal member may be at least a portion of a radiating element of an antenna.

In a multilayer substrate according to a preferred embodiment of the present invention, the conductor pattern may preferably include a signal conductor, the metal member may be disposed so as to surround at least three directions of the signal conductor, and a transmission line including the metal member and the signal conductor is provided. With this configuration, since the signal line conductor is also surrounded by the metal member, unnecessary radiation from the transmission line to the outside is reduced or prevented.

In a multilayer substrate according to a preferred embodiment of the present invention, the base may preferably include a hole provided along the metal member. With this configuration, when the transmission line includes the metal member and the signal conductor, dielectric loss occurring when a high-frequency signal is transmitted to the signal conductor is reduced or prevented.

An electronic device according to a preferred embodiment of the present invention includes a housing; and a multilayer substrate provided inside the housing. The multilayer substrate includes a base in which a plurality of insulating base material layers made of a thermoplastic resin are stacked; a conductor pattern provided on at least one of the insulating base material layers; and a metal member including a bent portion provided inside the base and being connected to the conductor pattern.

In this multilayer substrate, the metal member includes a portion extending in at least a stacking direction of the plurality of insulating base material layers and a portion extending in a planar direction parallel or substantially parallel to a principal surface of the plurality of insulating base material layers with the bent portion interposed therebetween. The metal member defines at least a portion of a circuit provided in contact with the base.

With this configuration, it is possible to provide an electronic device including a multilayer substrate in which a conductor (circuit) of a three-dimensional structure which has a desired shape and which is able to reduce or prevent conductor resistance loss is disposed.

In an electronic device according to a preferred embodiment of the present invention, the electronic device may preferably include a mounting substrate provided inside the housing, and the multilayer substrate may be mounted on the mounting substrate.

In a method of manufacturing a multilayer substrate according to a preferred embodiment of the present invention, the multilayer substrate includes: a base in which a plurality of insulating base material layers made of a thermoplastic resin are stacked; a conductor pattern provided on at least one of the insulating base material layers; and a metal member including a bent portion disposed inside the base and being connected to the conductor pattern. The manufacturing method includes a first step of forming the conductor pattern on at least one of the plurality of insulating base material layers; a second step of forming the metal member into a member which includes a portion extending in at least a stacking direction of the plurality of insulating base material layers and a portion extending in a planar direction parallel or substantially parallel to a principal surface of the plurality of insulating base material layers and in which at least a portion extends in the planar direction; a third step of forming an opening in predetermined ones of the plurality of insulating base material layers, so as to define a cavity corresponding to a shape of the metal member in the plurality of insulating base material layers; a fourth step of, after the first step to the third step, stacking the plurality of insulating base material layers and disposing the metal member in the cavity; and a fifth step of, after the fourth step, heating and pressing the stacked insulating base material layers to form the base and connect the metal member and a portion of the conductor pattern.

With this manufacturing method, it is possible to easily manufacture a multilayer substrate in which a conductor (circuit) having a three-dimensional structure which has a desired shape and which reduces or prevents conductor resistance loss is provided with a simple configuration.

In a method of manufacturing a multilayer substrate according to a preferred embodiment of the present invention, the manufacturing method further includes a sixth step of forming, in at least one of the plurality of insulating base material layers, an interlayer connection conductor made of a conductive paste extending in the stacking direction of the insulating base material layers.

The fourth step may preferably include a step of, after the sixth step, interposing a conductive bonding material between the metal member and a portion of the conductor pattern; the interlayer connection conductor and the conductive bonding material are materials having a melting point lower than the temperature at the time of heating and pressing in the fifth step; and in the fifth step, it is preferable that the metal member and the portion of the conductor pattern are connected with the conductive bonding material interposed therebetween, and the conductor pattern and the interlayer connection conductor formed in at least one of the plurality of insulating base material layers different from each other are connected.

In this manufacturing method, at the time of heating and pressing in the fifth step, it is possible to simultaneously perform connection between the metal member and the portion of the conductor pattern with the conductive bonding material interposed therebetween and connection between the conductor pattern and the interlayer connection conductor formed in the insulating base material layers different from each other. Accordingly, the manufacturing process is simplified.

In a method of manufacturing a multilayer substrate according to a preferred embodiment of the present invention, the second step may preferably include a step of plastically deforming the metal member.

With this manufacturing method, it is easy to shape a metal member having a desired three-dimensional structure.

According to various preferred embodiments of the present invention, it is possible to provide multilayer substrates in each of which a conductor (circuit) of a three-dimensional structure which has a desired shape and which reduces or prevents conductor resistance loss is provided inside with a simple configuration, and electronic devices including the multilayer substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
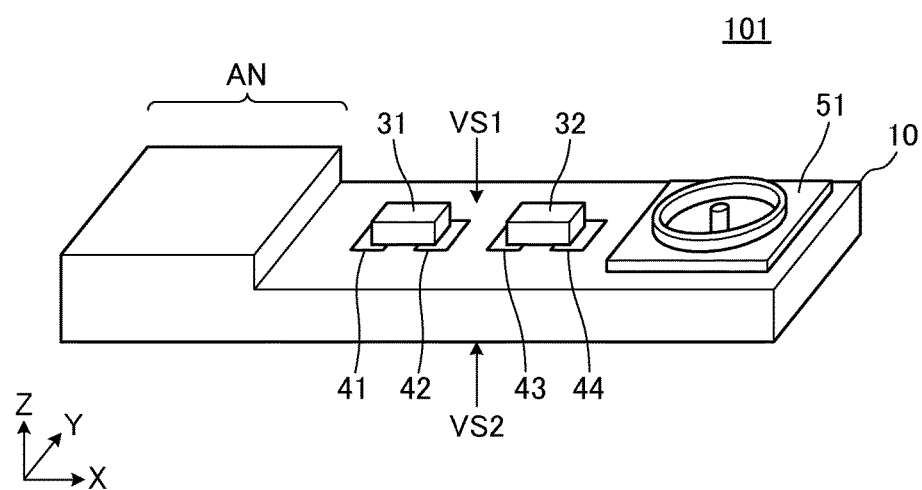
FIG. 1 is an external perspective view of a multilayer substrate 101 according to a first preferred embodiment of the present invention.

Hereinafter, several specific examples will be explained with reference to the drawings so as to describe a plurality of preferred embodiments of the present invention. In the drawings, identical elements are assigned the same reference signs. The preferred embodiments are merely examples, and configurations described in different preferred embodiments may partially replace each other or be combined with one another.

First Preferred Embodiment

Figure 2:
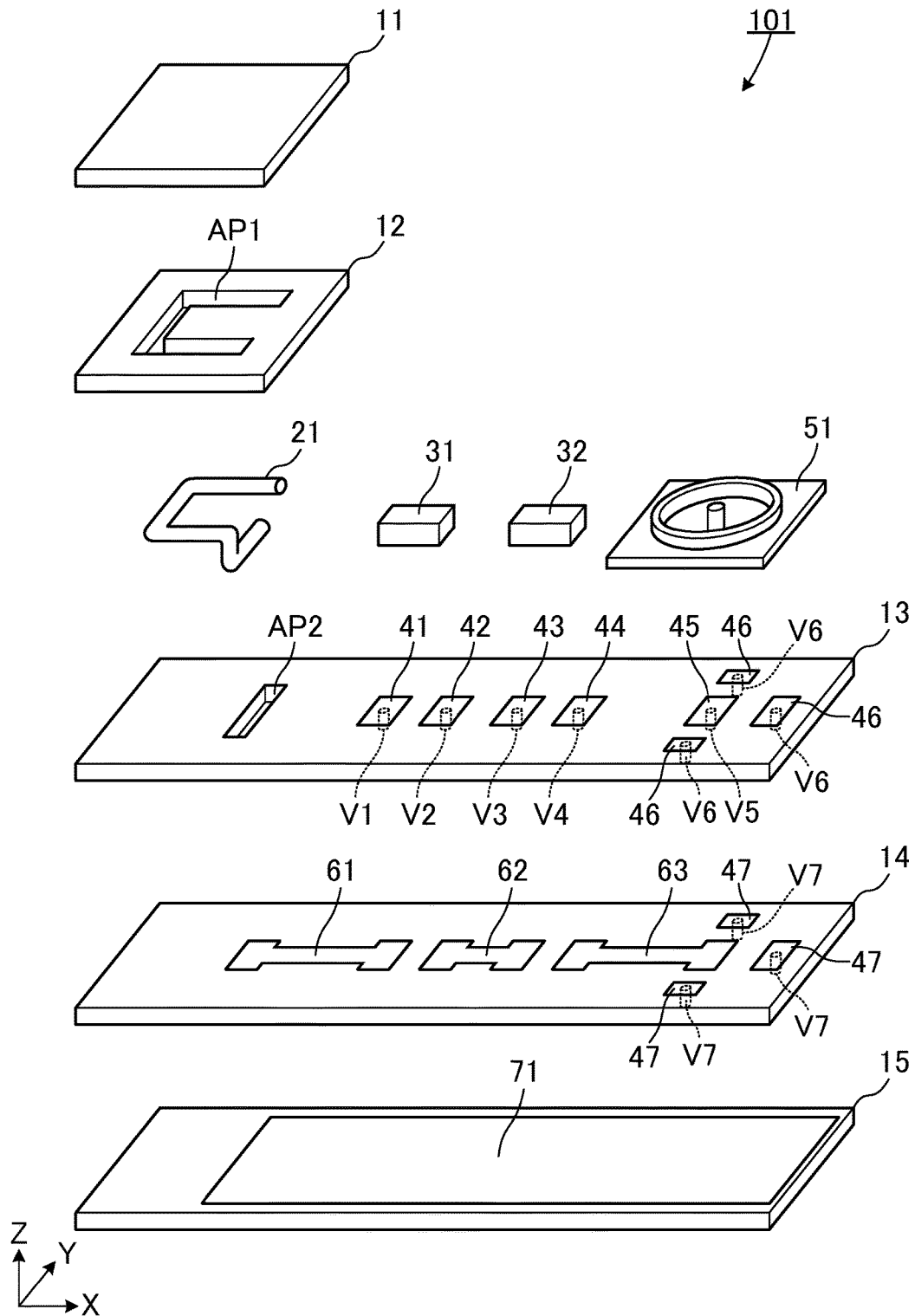
FIG. 2 is an exploded perspective view of the multilayer substrate 101.
Figure 3:
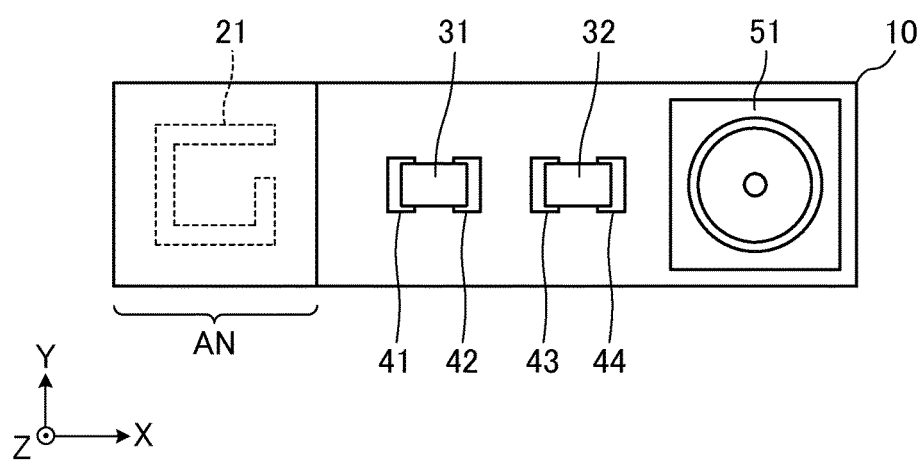
FIG. 3 is a plan view of the multilayer substrate 101.
Figure 4:
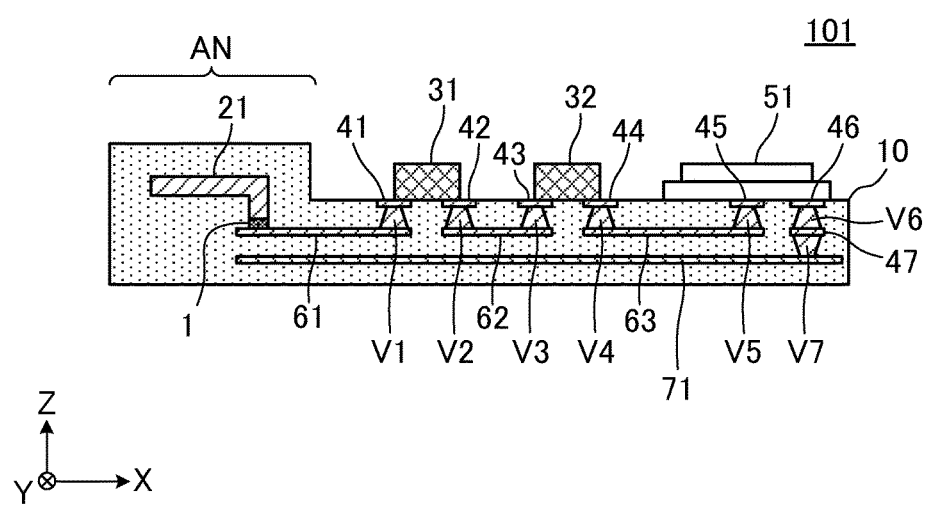
FIG. 4 is a cross-sectional view of the multilayer substrate 101.

FIG. 1 is an external perspective view of a multilayer substrate 101 according to a first preferred embodiment of the present invention. FIG. 2 is an exploded perspective view of the multilayer substrate 101. FIG. 3 is a plan view of the multilayer substrate 101. FIG. 4 is a cross-sectional view of the multilayer substrate 101. The multilayer substrate 101 according to the present preferred embodiment is a multilayer substrate in which a metal member defining and functioning as a radiating element of an antenna is provided or buried inside a base material defined by resin base material layers.

As shown in FIGS. 1 and 2, the multilayer substrate 101 includes a base material 10 including a first principal surface VS1 and a second principal surface VS2 facing the first principal surface VS1, a metal member 21, mounting components 31 and 32, and a connector 51. The metal member 21 is provided (buried) inside the base material 10. The mounting components 31 and 32 and the connector 51 are mounted on the first principal surface VS1 of the base material 10.

The base material 10 is a substantially elongated insulator flat plate whose longitudinal direction coincides or substantially coincides with the horizontal direction (X-axis direction in FIG. 1), and short-side direction coincides or substantially coincides with the vertical direction (Y-axis direction). The base material 10 is formed preferably by stacking insulating base material layers 11, 12, 13, 14, and 15, each preferably being made of a thermoplastic resin, for example, in the thickness direction (Z-axis direction in FIG. 1) and heating and pressing (thermocompression bonding) the stacked insulating base material layers 11, 12, 13, 14 and 15. The horizontal direction (X-axis direction) and the vertical direction (Y-axis direction) correspond to "a planar direction parallel or substantially parallel to a principal surface of an insulating base material layer", and the thickness direction (Z-axis direction) corresponds to "a stacking direction of insulating base material layers."

The insulating base material layer 11 is an uppermost layer and is a flat plate preferably having a square or substantially square planar shape. The insulating base material layer 12 is a flat plate having the same or substantially the shape as the insulating base material layer 11. An opening AP1 is provided in the insulating base material layer 12. The opening AP1 preferably has a U-shaped (C-shaped) planar shape and is a through hole extending from the upper surface to the lower surface of the insulating base material layer 12.

The insulating base material layer 13 is a flat plate preferably having a rectangular or substantially rectangular planar shape. On an upper surface of the insulating base material layer 13, electrodes 41, 42, 43, 44, and 45 and three ground electrodes 46 are provided, for example. The electrodes 41, 42, 43, and 44 are preferably rectangular or substantially rectangular conductor patterns and are sequentially arranged at the center or approximate center in a short-side direction (Y-axis direction) of the insulating base material layer 13, and are aligned along a longitudinal direction (X-axis direction) of the insulating base material layer 13. The electrode 45 and the ground electrodes 46 are preferably rectangular or substantially rectangular conductor patterns and are located near one end (the right side end of the insulating base material layer 13 in FIG. 2) in the longitudinal direction (X-axis direction) of the insulating base material layer 13.

In the insulating base material layer 13, interlayer connection conductors V1, V2, V3, V4, V5, and V6 are provided. The interlayer connection conductors V1, V2, V3, V4, V5, and V6 are conductors extending in the thickness direction (Z-axis direction) of the insulating base material layer 13. The interlayer connection conductor V1 is connected to the electrode 41, and the interlayer connection conductor V2 is connected to the electrode 42. The interlayer connection conductor V3 is connected to the electrode 43, and the interlayer connection conductor V4 is connected to the electrode 44. The interlayer connection conductor V5 is connected to the electrode 45, and the interlayer connection conductors V6 are connected respectively to the three ground electrodes 46. The interlayer connection conductor is preferably, for example, a via conductor formed by forming a via hole in the insulating base material layer and filling the via hole with a conductive paste. The interlayer connection conductor preferably includes, for example, at least one of Sn, Cu, Ag, Ni, and Mo or an alloy thereof.

An opening AP2 is provided in the insulating base material layer 13. The opening AP2 has a linear (I-shaped) planar shape and is a through hole extending from the upper surface to the lower surface of the insulating base material layer 13. The opening AP2 is disposed at a position closer to the other end (the left side end of the insulating base material layer 13 in FIG. 2) from the center in the longitudinal direction (X-axis direction) of the insulating base material layer 13.

The insulating base material layer 14 is a flat plate preferably having a rectangular or substantially rectangular planar shape. On an upper surface of the insulating base material layer 14, conductors 61, 62, and 63, and three ground conductors 47 are provided. The conductors 61, 62, and 63 are linear (I-shaped) conductor patterns and are sequentially arranged at the center or approximate center in a short-side direction (Y-axis direction) of the insulating base material layer 14, and are aligned along a longitudinal direction (X-axis direction). One end (the right side end of the conductor 61 in FIG. 2) of the conductor 61 is connected to the electrode 41 with the interlayer connection conductor V1 interposed therebetween. The other end (the left side end of the conductor 62 in FIG. 2) of the conductor 62 is connected to the electrode 42 with the interlayer connection conductor V2 interposed therebetween, and one end (the right side end of the conductor 62 in FIG. 2) of the conductor 62 is connected to the electrode 43 with the interlayer connection conductor V3 interposed therebetween. The other end (the left side end of the conductor 63 in FIG. 2) of the conductor 63 is connected to the electrode 44 with the interlayer connection conductor V4 interposed therebetween, and one end (the right side end of the conductor 63 in FIG. 2) of the conductor 63 is connected to the electrode 45 with the interlayer connection conductor V5 interposed therebetween.

The ground conductors 47 are preferably rectangular or substantially rectangular conductor patterns and are disposed near one end in the longitudinal direction (X-axis direction) of the insulating base material layer 14. The three ground conductors 47 are connected respectively to the ground electrodes 46 with the interlayer connection conductors V6 interposed therebetween. In the insulating base material layer 14, interlayer connection conductors V7 are provided. The interlayer connection conductors V7 are conductors extending in the thickness direction (Z-axis direction) of the insulating base material layer 14. The interlayer connection conductors V7 are connected respectively to the three ground electrodes 47, for example.

The insulating base material layer 15 is a lowermost layer and is a flat plate preferably having a rectangular or substantially rectangular planar shape. On an upper surface of the insulating base material layer 15, a ground conductor 71 is provided. The ground conductor 71 is a rectangular or substantially rectangular conductor pattern. The ground conductor 71 is connected to the ground electrodes 46 with the interlayer connection conductor V7, the ground conductor 47, and the interlayer connection conductor V6 interposed therebetween.

It is preferable that the interlayer connection conductor includes the same material as the conductor pattern (the electrodes 41, 42, 43, 44, and 45, the ground electrode 46, the conductors 61, 62, and 63, and the ground conductors 47 and 71).

The base material 10 is formed preferably by stacking the insulating base material layers 11, 12, 13, 14, and 15 and heating and pressing stacked the insulating base material layers 11, 12, 13, 14 and 15. At this time, by stacking the insulating base material layers 12 and 13 respectively including the openings AP1 and AP2 and the insulating base material layers 11 and 14 without openings, a cavity is formed inside the stacked insulating base material layers 11, 12, 13, 14, and 15. This cavity extends in the thickness direction (Z-axis direction) and the planar direction (X-axis direction or Y-axis direction) parallel or substantially parallel to principal surfaces of the insulating base material layers 11, 12, 13, 14, and 15 so as to correspond to the shape of the metal member 21. The metal member 21 is provided (buried) in this cavity. The insulating base material layers 11, 12, 13, 14, and 15 are each preferably made of a thermoplastic resin, for example, and the resin flows into this cavity at the time of heating and pressing, so that after the heating and pressing, almost no gap remains inside the base material 10.

The metal member 21 is a three-dimensional structure defining at least a portion of a circuit provided in contact with the base material 10 and including a portion extending in a thickness direction (Z-axis direction) and a portion extending in a planar direction (X-axis direction or Y-axis direction) with a bent portion interposed between the portion extending in the thickness direction and the portion extending in the planar direction. More specifically, the metal member 21 is a wire member in which a U-shaped (C-shaped) first portion extending in the planar direction (X-axis direction and Y-axis direction), a second portion extending in the thickness direction (Z-axis direction), and a third portion extending in the planar direction (Y-axis direction) are integrated so as to define a unitary monolithic structure in which the first, second and third portions are continuous and integral. In a preferred embodiment of the present invention, the third portion extending in the planar direction (X-axis direction or Y-axis direction) is an important structural element of the metal member 21.

As shown in FIG. 4, one end of the metal member 21 is connected to the other end (the left side end of the conductor 61 in FIG. 2) of the conductor 61 with a conductive bonding material 1 interposed therebetween. The conductive bonding material 1 preferably includes, for example, at least one of Sn, Cu, Ag, Ni, and Mo or an alloy thereof.

The metal member 21 is preferably, for example, a cylindrical or substantially cylindrical copper wire, which is obtained preferably by cutting a copper wire having a circular or substantially circular cross section in a predetermined length-unit and shaping by plastic deformation (e.g., forging). The metal member 21 may be formed to have a three-dimensional structure by casting, for example. The cross-sectional shape of the metal member 21 does not necessarily need to be circular or substantially circular as described in detail later. The material of the metal member 21 is not necessarily limited to copper, and for example, Cu—Zn, Al or other suitable material may be used.

As shown in FIG. 4, the thickness of the metal member 21 in the Z-axis direction is larger than the thickness of the conductor pattern (the electrodes 41, 42, 43, 44, and 45, the ground electrodes 46, the conductors 61, 62, and 63, and the ground conductors 47 and 71) in the Z-axis direction.

The metal member 21 of the present preferred embodiment preferably defines and functions as, for example, a radiating element of an UHF band antenna. Thus, as shown in FIGS. 3 and 4, in the multilayer substrate 101, an antenna portion AN in which the metal member 21 is provided (buried) inside the base material 10 is provided.

The electrodes 41, 42, 43, 44, and 45 and the ground electrodes 46 are exposed on the first principal surface VS1 of the base material 10. As shown in FIG. 4, the mounting components 31 and 32 and the connector 51 are mounted on the first principal surface VS1 of the base material 10. The mounting component 31 is electrically connected (bonded) between the electrode 41 and the electrode 42, and the mounting component 32 is electrically connected (bonded) between the electrode 43 and the electrode 44. Further, the connector 51 is electrically connected (bonded) to the electrode 45 and the three ground electrodes 46, respectively. This connection (bonding) may be provided by using, for example, solder, a conductive bonding material, or other suitable bonding material.

The mounting components 31 and 32 are preferably, for example, reactance elements to match the impedance of the metal member 21 defining and functioning as the antenna portion AN, and the connector 51 preferably includes, for example, a connecting portion to connect to a receptacle mounted on another circuit board. As will be described in detail later, the mounting components 31 and 32 and the connector 51 are not required and may be omitted.

In this manner, a circuit including the antenna portion AN (metal member 21) and the reactance elements to match the impedance (mounting components 31 and 32) connected in series is provided in contact with the base material 10 of the multilayer substrate 101 according to the present preferred embodiment.

The multilayer substrate 101 according to the present preferred embodiment provides the following advantageous effects.

In the multilayer substrate 101, the metal member 21 prepared in advance to have a three-dimensional structure is provided (buried) in the base material 10. The interlayer connection conductor is provided by, for example, filling a conductive paste in a via hole formed in an insulating base material layer and solidifying the conductive paste by heating and pressing. Since a solvent included in the conductive paste volatilizes during this heating and pressing, the filling rate of conductive particles is low. Thus, in general, the volume resistivity of an interlayer connection conductor, such as a via conductor, formed by solidifying a conductive paste is higher than that of a single metal. On the other hand, in the multilayer substrate 101 according to the present preferred embodiment, a conductor (circuit) having a three-dimensional structure is able to be provided inside the base material 10 without using such an interlayer connection conductor made of a conductive paste. Thus, as compared to a case in which the conductor (circuit) having a three-dimensional structure is provided inside the base material 10 by using a large number of the interlayer connection conductors, the conductor resistance loss of the entire circuit is reduced.

Since the metal member 21 has higher rigidity than the conductor pattern, deformation of the metal member 21 at the time of heating and pressing is reduced or prevented. In addition, by providing (burying) the metal member 21 inside the base material 10, deformation due to external forces or other causes is reduced or prevented at a portion (for example, the antenna portion AN in FIG. 3) in which the metal member 21 of the base material 10 is provided (buried).

The multilayer substrate 101 of the present preferred embodiment in which the metal member 21 prepared in advance to have a three-dimensional structure is provided (buried) inside the base material 10. Thus, it is easy to shape the metal member 21 having a desired three-dimensional structure. Further, in the present preferred embodiment, a cavity corresponding to the shape of the metal member 21 is provided inside the insulating base material layers 11, 12, 13, 14, and 15 before heating and pressing, and the metal member 21 is disposed in this cavity. Thus, it is possible to easily provide the multilayer substrate 101 in which the metal member 21 having a desired three-dimensional structure is provided (buried) inside the base material 10.

Further, with this configuration, when the conductor (circuit) having a three-dimensional structure is provided inside the base material 10, it is not necessary to provide a conductor pattern on or an interlayer connection conductor in the insulating base material layer. Thus, the manufacturing process is simplified. Furthermore, with this configuration, since the metal member 21 prepared in advance to have a three-dimensional structure is used, electrical connection reliability is high as compared to a case in which the conductor (circuit) having a three-dimensional structure is defined by the conductor pattern and the interlayer connection conductor.

In the multilayer substrate 101, the thickness of the metal member 21 in the Z-axis direction is preferably larger than the thickness of the conductor pattern (the electrodes 41, 42, 43, 44, and 45, the ground electrodes 46, the conductors 61, 62, and 63, and the ground conductors 47 and 71) in the Z-axis direction. With this configuration, the DCR (direct current resistance) of the metal member 21 is reduced, and the conductor resistance loss is reduced. The strength of the metal member 21 is increased by increasing the thickness of the metal member 21 in the Z-axis direction, and deformation of the metal member 21 during heating and pressing or due to external force or other forces is further reduced or prevented.

In the multilayer substrate 101 according to the present preferred embodiment, the metal member 21 is preferably made of the same material as the conductor pattern (the electrodes 41, 42, 43, 44, and 45, the ground electrodes 46, the conductors 61, 62, and 63, and the ground conductors 47 and 71). With this configuration, for example, when a conductive bonding material includes Sn and the metal member and the conductor pattern include Cu, it is easy to form a solid phase diffusion layer between Sn and Cu. Accordingly, it is preferable to match the materials of the metal member and the conductor pattern.

In the multilayer substrate 101, the interlayer connection conductors V1, V2, V3, V4, V5, V6, and V7 and the conductor patterns (the electrodes 41, 42, 43, 44, and 45, the ground electrodes 46, the conductors 61, 62, and 63, and the ground conductors 47 and 71) are preferably connected by solid phase diffusion bonding. For example, a solid phase diffusion layer, such as $Cu_6Sn_5$, is formed at an interface between Sn included in a conductive paste of the interlayer connection conductor and Cu included in the conductor pattern by heat during thermocompression bonding. With this configuration, since the interlayer connection conductor and the conductor pattern are bonded face to face, electrical and mechanical connection reliability of connection between the interlayer connection conductor and the conductor pattern is high. The materials of the interlayer connection conductor and the conductor pattern may be any combination that is connected by solid phase diffusion bonding. The interlayer connection conductor and the conductor pattern are not limited to being connected by solid phase diffusion bonding.

A non-limiting example of a method of manufacturing the multilayer substrate 101 is as follows.

First, the insulating base material layers 11, 12, 13, 14, and 15 in a collective substrate state are prepared. For the insulating base material layers 11, 12, 13, 14, and 15, for example, a thermoplastic resin base material, such as a liquid crystal polymer, is preferably used.

Then, a metal foil (for example, copper foil) is laminated on one of the principal surfaces of the insulating base layers 13, 14, and 15 in the collective substrate state, and the metal foil is patterned by photolithography, thus forming a conductor pattern (the electrodes 41, 42, 43, 44, and 45, the ground electrodes 46, the conductors 61, 62, and 63, and the ground conductors 47 and 71). This step of forming the conductor patterns (the electrodes 41, 42, 43, 44, and 45, the ground electrodes 46, the conductors 61, 62, and 63, and the ground conductors 47 and 71) on the insulating base material layers 13, 14, and 15 is an example of the "first step".

Then, the interlayer connection conductors V1, V2, V3, V4, V5, V6, and V7 are formed in the insulating base material layers 13 and 14 in the collective substrate state. This process of forming the interlayer connection conductors V1, V2, V3, V4, V5, V6, and V7, extending in the thickness direction (Z-axis direction), in the insulating base material layers 13 and 14 is an example of the "sixth step."

The interlayer connection conductors V1, V2, V3, V4, V5, V6, and V7 are provided by forming a through hole with a laser or other suitable method, then filling a conductive paste including one or more of Cu, Ag, Sn, Ni, and Mo or an alloy thereof, and solidifying the conductive paste through the subsequent heating and pressing (the "fifth step"). Thus, the interlayer connection conductors V1, V2, V3, V4, V5, V6, and V7 are each preferably made of a material having a melting point lower than the temperature at the time of the subsequent heating and pressing.

The metal member 21 is formed to have a shape which includes a portion extending in a thickness direction (Z-axis direction) and a portion extending in a planar direction (X-axis direction or Y-axis direction) and in which at least a portion thereof extends in the planar direction (X-axis direction or Y-axis direction). The metal member 21 is preferably, for example, a copper wire and may be Cu—Zn, Al, or other suitable material. This step of forming the metal member 21 such that the metal member 21 has a three-dimensional structure is an example of the "second step".

Although the metal member 21 is preferably formed to have a three-dimensional structure by, for example, cutting a copper wire having a circular or substantially circular cross section in a predetermined length-unit and shaping by plastic deformation (e.g., forging), the present invention is not limited to this method. The metal member 21 may be formed to have a three-dimensional structure by casting, for example.

Then, the openings AP1 and AP2 defining a cavity inside the stacked insulating base material layers 11, 12, 13, 14, and 15 are formed in the insulating base material layers 12 and 13. The insulating base material layers 12 and 13 including the openings AP1 and AP2 correspond to the "predetermined insulating base material layer". This step of forming the openings AP1 and AP2 in the insulating base material layers 12 and 13 is an example of the "third step".

After the above steps, the insulating base material layers 11, 12, 13, 14, and 15 are stacked, and the shaped metal member 21 is disposed inside the cavity (openings AP1 and AP2). This step of stacking the insulating base material layers 11, 12, 13, 14, and 15 and storing the shaped metal member 21 inside the cavity (openings AP1 and AP2) is an example of the "fourth step".

At this time, it is preferable to interpose the conductive bonding material 1 between the metal member 21 and a portion of the conductor 61 (conductor pattern) formed on the insulating base material layer 14. The conductive bonding material 1 may be formed at one end of the metal member 21 or may be formed at a portion of the conductor 61 (conductor pattern) formed on the insulating base material layer 14. By melting the conductive bonding material 1 in the subsequent heating and pressing step ("fifth step"), the metal member 21 and a portion of the conductor 61 are connected with the conductive bonding material 1 interposed therebetween. Thus, the conductive bonding material 1 is preferably made of a material having a melting point lower than the temperature at the time of the subsequent heating and pressing as in the interlayer connection conductors V1, V2, V3, V4, V5, V6, and V7. The conductive bonding material 1 preferably includes, for example, at least one of Sn, Cu, Ag, Ni, and Mo or an alloy thereof.

Thereafter, the stacked insulating base material layers 11, 12, 13, 14, and 15 are heated and pressed (laminated) to form the base material 10. The base material 10 is formed by heating and pressing the stacked insulating base material layers 11, 12, 13, 14, and 15, and the metal member 21 and a portion of the conductor 61 (conductor pattern) formed on the insulating base material layer 14 are connected. This step is an example of the "fifth step".

At this time, one end of the metal member 21 disposed inside the base material 10 is connected to the other end of the conductor 61 formed on the insulating base material layer 14 with the conductive bonding material 1 interposed therebetween. In addition, the conductor patterns and the interlayer connection conductors (the conductor 61 and the interlayer connection conductor V1, the conductor 62 and the interlayer connection conductors V2 and V3, the conductor 63 and the interlayer connection conductors V4 and V5, the ground conductors 47 and the interlayer connection conductors V6, and the ground conductor 71 and the interlayer connection conductors V7) formed on or in the insulating base material layers 13, 14, and 15 different from each other are connected. Thus, the conductive bonding material 1 is preferably the same as the material forming the interlayer connection conductors V1, V2, V3, V4, V5, V6, and V7.

Then, the mounting components 31 and 32 and the connector 51 are mounted on the first principal surface VS1 of the base material 10. Specifically, the mounting component 31 is electrically connected (bonded) between the electrode 41 and the electrode 42, and the mounting component 32 is electrically connected (bonded) between the electrode 43 and the electrode 44. Further, the connector 51 is electrically connected (bonded) to the electrode 45 and the three ground electrodes 46, respectively. This connection (bonding) may preferably be performed by using, for example, solder, a conductive bonding material, or other suitable bonding material.

With the above manufacturing method, it is possible to easily manufacture a multilayer substrate in which a conductor (circuit) of a three-dimensional structure which has a desired shape and which reduces or prevents conductor loss is provided with a simple configuration.

In the above manufacturing method, the interlayer connection conductors V1, V2, V3, V4, V5, V6, and V7 and the conductive bonding material 1 are preferably materials each having a melting point lower than the temperature at the time of heating and pressing. Thus, at the time of heating and pressing, it is possible to simultaneously perform connection between the metal member 21 and a portion of the conductor 61 with the conductive bonding material 1 interposed therebetween and connection between the conductor patterns (the electrodes 41, 42, 43, 44, and 45, the ground electrodes 46, the conductors 61, 62, and 63, and the ground conductors 47 and 71) and the interlayer connection conductors V1, V2, V3, V4, V5, V6, and V7 formed on or in the insulating base material layers different from each other. Accordingly, the manufacturing process is simplified.

The metal member 21 is shaped by plastic deformation to have a three-dimensional structure. With this manufacturing method, it is easy to shape a metal member 21 having a desired three-dimensional structure.

In the above manufacturing method, although the electronic device preferably is manufactured in the order of the first step, the sixth step, the second step, the third step, the fourth step, and the fifth step, for example, the present invention is not limited to this configuration. The order of the first step, the second step, the third step, and the sixth step may be suitably changed as long as the fourth step and the fifth step are performed in this order after the first step, the second step, the third step, and the sixth step.

Second Preferred Embodiment

Figure 5A:
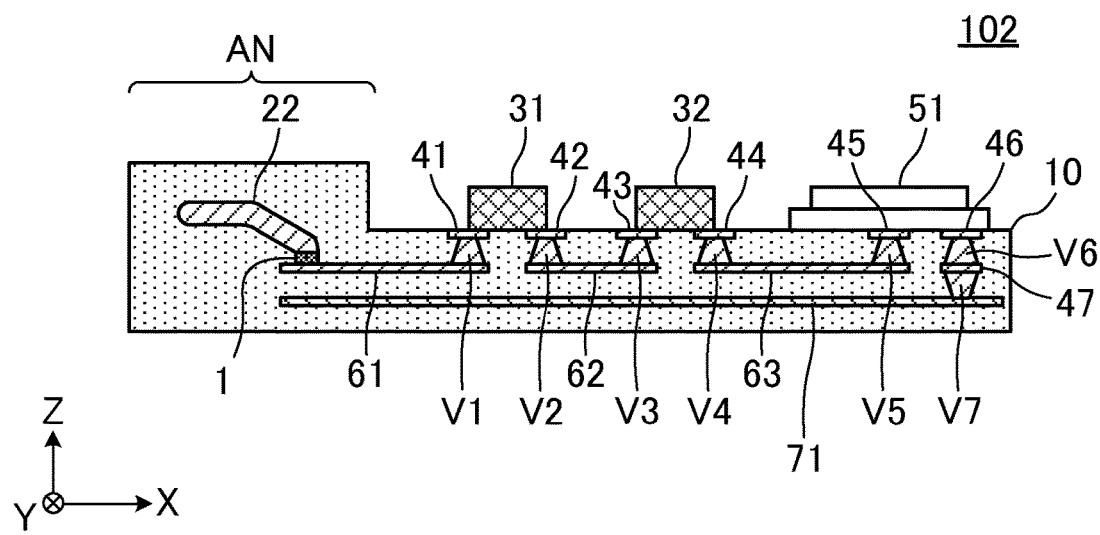
FIG. 5A is a cross-sectional view of a multilayer substrate 102 according to a second preferred embodiment of the present invention.
Figure 5B:
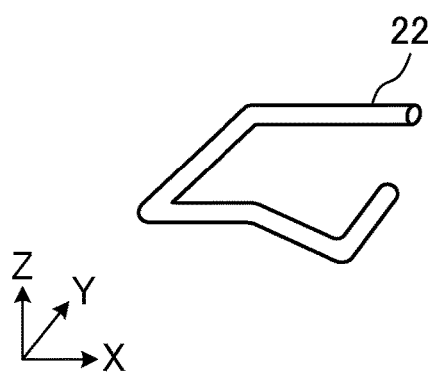
FIG. 5B is an external perspective view of a metal member 22 disposed inside a base material 10 of the multilayer substrate 102.

FIG. 5A is a cross-sectional view of a multilayer substrate 102 according to a second preferred embodiment of the present invention, and FIG. 5B is an external perspective view of a metal member 22 provided inside a base material 10 of the multilayer substrate 102.

The multilayer substrate 102 according to the second preferred embodiment is different from the multilayer substrate 101 according to the first preferred embodiment in the shape of the metal member 22 provided (buried) inside the base material 10. Other configurations are the same or substantially the same as those of the multilayer substrate 101. Hereinafter, portions different from the multilayer substrate 101 according to the first preferred embodiment will be described.

The metal member 22 preferably is a member in which a U-shaped (C-shaped) portion extending in the planar direction (X-axis direction and Y-axis direction), a portion extending in the thickness direction (Z-axis direction) and the horizontal direction (X-axis direction), and a portion extending in the planar direction (Y-axis direction) are integrated with a bent portion interposed between the member extending in the planar direction and the portion extending in at least the thickness direction so as to define an integrated unitary monolithic structure. As shown in FIG. 5A, the metal member 22 includes a portion extending at an acute angle (more than 0° and less than 90°) with respect to the thickness direction (Z-axis direction). In other words, the metal member 22 does not include a portion extending in the thickness direction (Z-axis direction), and includes a portion extending in an oblique direction with respect to the planar direction (X-axis direction and Y-axis direction).

Figure 6A:
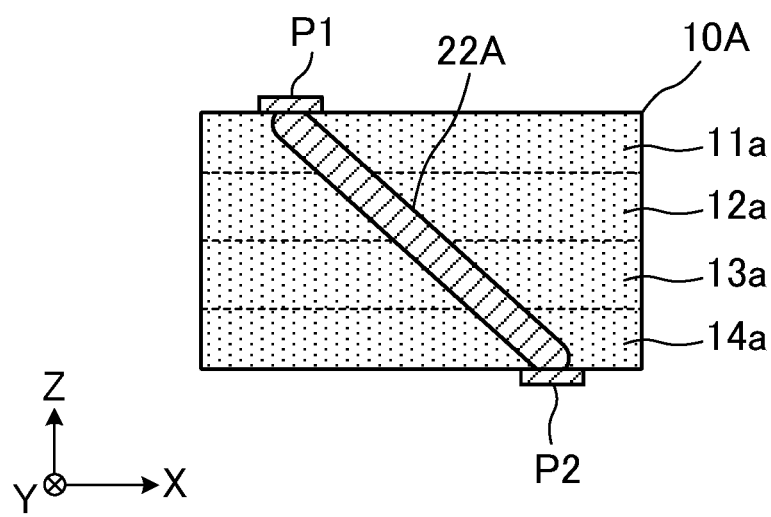
FIG. 6A is a cross-sectional view of a base material 10A in which a metal member 22A extending at an acute angle with respect to a thickness direction (Z-axis direction) is provided.

Next, the advantages obtained with the metal member including a portion extending at an acute angle (more than 0° and less than 90°) with respect to the thickness direction (Z-axis direction) will be described with reference to the drawings. FIG. 6A is a cross-sectional view of a base material 10A which include a metal member 22A extending at an acute angle with respect to the thickness direction (Z-axis direction) therein, and FIG. 6B is a cross-sectional view of a base material 10B as a comparative example, which includes conductors 61, 62, and 63 and interlayer connection conductors V11, V12, V13, and V14 therein.

Figure 6B:
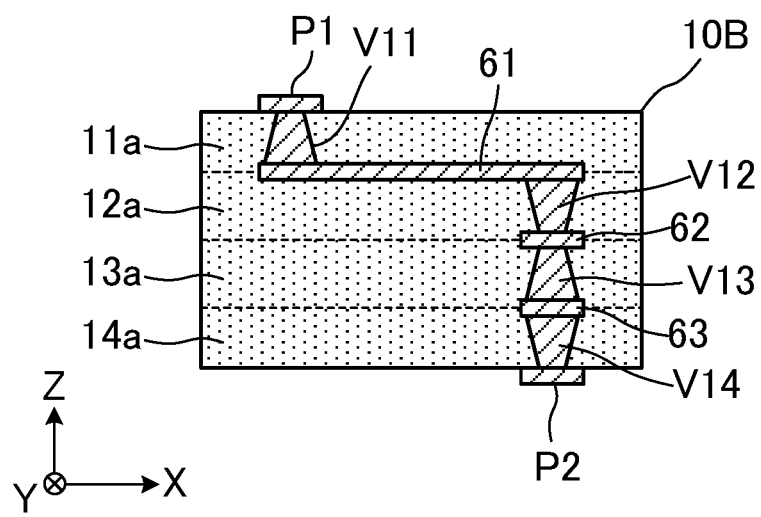
FIG. 6B is a cross-sectional view of a base material 10B as a comparative example, in which conductors 61, 62, and 63 and interlayer connection conductors V11, V12, V13, and V14 are provided.

The base materials 10A and 10B shown in FIGS. 6A and 6B are each formed by stacking insulating base material layers 11a, 12a, 13a, and 14a, each preferably made of a thermoplastic resin, for example, in the thickness direction (Z-axis direction) and heating and pressing (laminating) the stacked insulating base material layers 11a, 12a, 13a, and 14a. An electrode P1 is provided on each upper surface of the base materials 10A and 10B, and an electrode P2 is provided on each lower surface of the base materials 10A and 10B. The electrode P1 is located near one side surface (the left side surface of the base materials 10A and 10B in FIGS. 6A and 6B) of the base materials 10A and 10B, the electrode P2 is located near the other side surface (the right side surface of the base materials 10A and 10B in FIGS. 6A and 6B) of the base materials 10A and 10B. The base materials 10A and 10B include different conductors provided (buried) therein, and other configurations are the same or substantially the same.

The metal member 22A is provided (buried) inside the base material 10A. As shown in FIG. 6A, the metal member 22A is a linear member extending at an acute angle (more than 0° and less than 90°) with respect to the thickness direction (Z-axis direction) with a bent portion interposed therebetween. One end of the metal member 22A is connected to the electrode P1, and the other end of the metal member 22A is connected to the electrode P2. That is, the electrode P1 and the electrode P2 are connected with the metal member 22A interposed therebetween.

On the other hand, the conductors 61, 62, and 63 and the interlayer connection conductors V11, V12, V13, and V14 are provided (buried) inside the base material 10B. The electrode P1 and the electrode P2 are connected with the conductors 61, 62, and 63 and the interlayer connection conductors V11, V12, V13, and V14 interposed therebetween.

As shown in FIGS. 6A and 6B, as compared to a case in which a portion extending in the thickness direction (Z-axis direction) and a portion extending in the planar direction (X-axis direction or Y-axis direction) are combined to define a conductor having a three-dimensional structure, the length of the entire conductor is shortened by including a portion extending at an acute angle (more than 0° and less than 90°) with respect to the thickness direction (Z-axis direction). Accordingly, with this configuration, it is possible to shorten a conductor length of the entire metal member and to further reduce the conductor resistance loss.

Third Preferred Embodiment

In a third preferred embodiment of the present invention, a multilayer substrate in which a portion of a metal member is exposed from a base material is described.

Figure 7A:
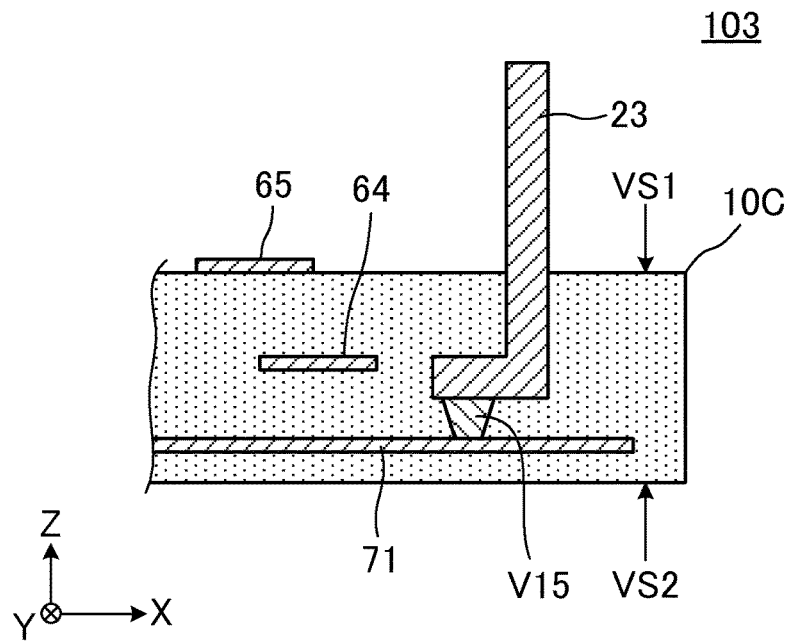
FIG. 7A is a cross-sectional view showing a main portion of a multilayer substrate 103 according to a third preferred embodiment of the present invention.
Figure 7B:
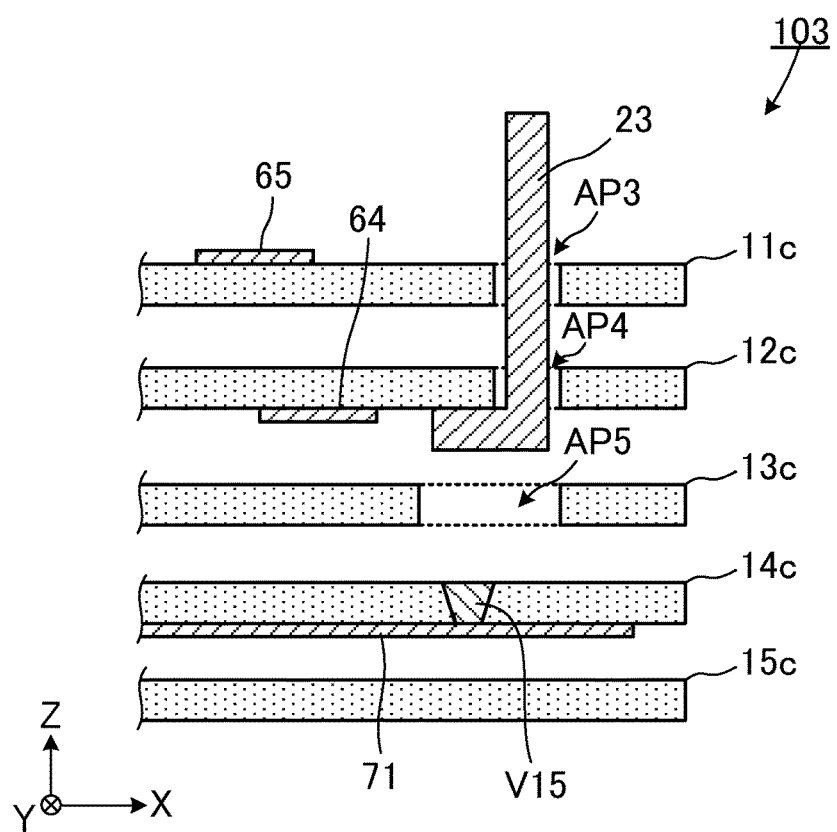
FIG. 7B is an exploded cross-sectional view showing the main portion of the multilayer substrate 103.
Figure 8:
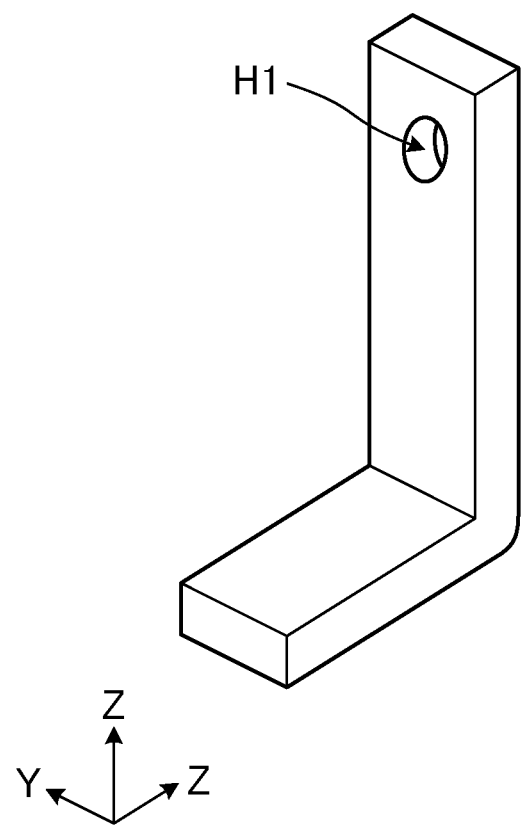
FIG. 8 is a perspective view of a metal member 23 included in the multilayer substrate 103.

FIG. 7A is a cross-sectional view showing a main portion of a multilayer substrate 103 according to the third preferred embodiment, and FIG. 7B is an exploded cross-sectional view showing the main portion of the multilayer substrate 103. FIG. 8 is a perspective view of a metal member 23 included in the multilayer substrate 103.

The multilayer substrate 103 according to the third preferred embodiment is different from the multilayer substrate 101 according to the first preferred embodiment in that a portion of the metal member is exposed from the base material. The multilayer substrate 103 is different from the multilayer substrate 101 in that the multilayer substrate 103 includes conductors 64 and 65. Other configurations are the same or substantially the same as those of the multilayer substrate 101. Hereinafter, portions different from the multilayer substrate 101 according to the first preferred embodiment will be described.

As shown in FIG. 7A, the multilayer substrate 103 includes a base material 10C, the metal member 23, and the like. The conductor 65 is provided on a first principal surface VS1 of the base material 10C, and the conductor 64, an interlayer connection conductor V15, and a ground conductor 71 are provided inside the base material 10C.

The metal member 23 is bent in an L shape, and is a three-dimensional structure in which a portion extending in the planar direction (X-axis direction) and a portion extending in the thickness direction (Z-axis direction) are integrated with the bent portion interposed between the portion extending in the planar direction and the portion extending in the thickness direction. As shown in FIG. 7A, a portion of the metal member 23 is disposed inside the base material 10C, and another portion of the metal member 23 is exposed to the outside of the base material 10C. One end of the metal member 23 is connected to the ground conductor 71 with the interlayer connection conductor V15 interposed therebetween. A through hole H1 is provided near the other end of the metal member 23.

As shown in FIG. 7B, the base material 10C is formed preferably by stacking insulating base material layers 11c, 12c, 13c, 14c, and 15c in the thickness direction (Z-axis direction) and heating and pressing stacked the insulating base material layers 11c, 12c, 13c, 14c, and 15c. The insulating base material layer 11c is an uppermost layer, and the insulating base material layer 15c is a lowermost layer.

On an upper surface of the insulating base material layer 11c, the conductor 65 is provided. An opening AP3 is provided in the insulating base material layer 11c. The opening AP3 is a through hole extending from the upper surface to the lower surface of the insulating base material layer 11c.

On a lower surface of the insulating base material layer 12c, the conductor 64 is provided. An opening AP4 is provided in the insulating base material layer 12c. The opening AP4 is a through hole extending from the upper surface to the lower surface of the insulating base material layer 12c. The other end of the metal member 23 is inserted through the opening AP4 provided in the insulating base material layer 12c, and one end of the metal member 23 is applied onto the lower surface of the insulating base material layer 12c.

An opening AP5 is provided in the insulating base material layer 13c. The opening AP5 is a through hole extending from an upper surface to the lower surface of the insulating base material layer 13c.

On a lower surface of the insulating base material layer 14c, the ground conductor 71 is provided. In the insulating base material layer 14c, the interlayer connection conductor V15 is provided.

The base material 10C is formed preferably by stacking the insulating base material layers 11c, 12c, 13c, 14c, and 15c and heating and pressing stacked the insulating base material layers 11c, 12c, 13c, 14c, and 15c. At this time, by stacking the insulating base material layers 11c, 12c, and 13c respectively including the openings AP3, AP4, and AP5 and the insulating base material layer 14c and 15c without an opening, a cavity is formed inside the stacked insulating base material layers 11c, 12c, 13c, 14c, and 15c. This cavity extends in the thickness direction (Z-axis direction) and the planar direction (X-axis direction or Y-axis direction) so as to correspond to the shape of a portion of the metal member 23. A portion of the metal member 23 is provided (buried) in this cavity. As described above, the insulating base material layers 11c, 12c, 13c, 14c, and 15c are each preferably made of a thermoplastic resin, for example, and the resin flows into this cavity at the time of heating and pressing.

As described in the present preferred embodiment, a portion of the metal member may be disposed inside the base material, and another portion may be exposed from the base material. In the case in which a portion of the metal member is disposed inside the base material as in the present preferred embodiment, the portion of the metal member disposed inside the base material may be a member which includes a portion extending in the thickness direction (Z-axis direction) and a portion extending in the planar direction (X-axis direction or Y-axis direction).

Figure 9:
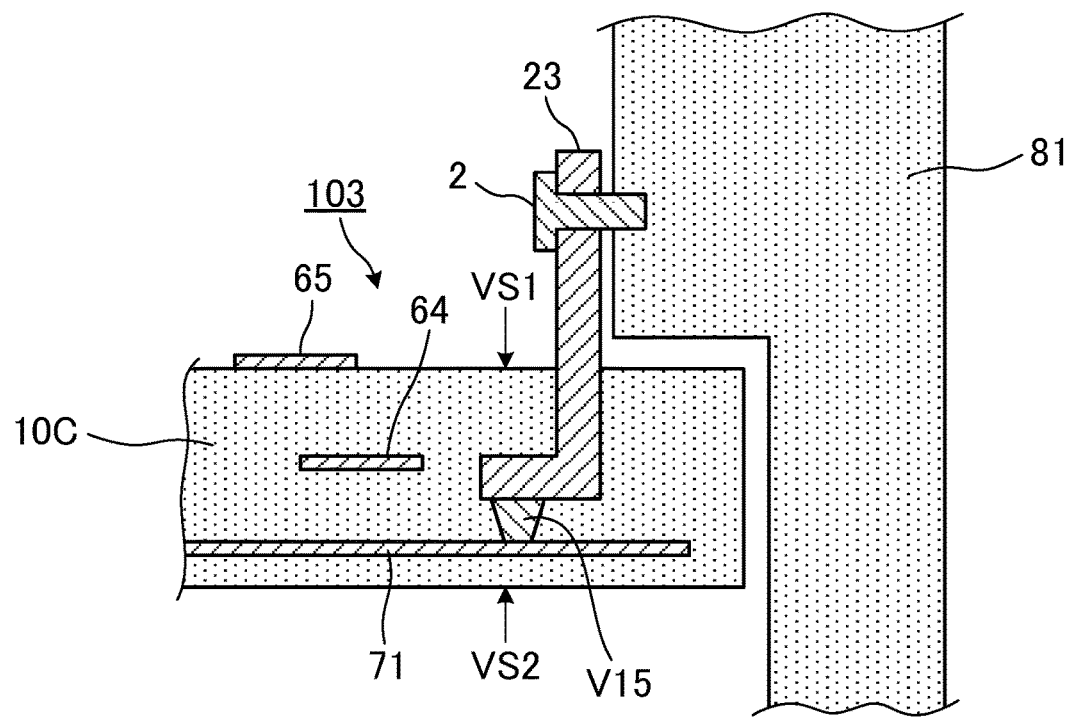
FIG. 9 is a cross-sectional view showing a main portion of an electronic device 201 according to the third preferred embodiment of the present invention.

FIG. 9 is a cross-sectional view showing a main portion of an electronic device 201 according to the third preferred embodiment.

The electronic device 201 according to the present preferred embodiment includes a metal housing 81, the multilayer substrate 103 provided in the metal housing 81, a connecting member 2, and the like. The connecting member 2 is inserted through the through hole H1 provided near the other end of the metal member 23. The other end of the metal member 23 of the multilayer substrate 103 is fixed to the metal housing 81 by the connecting member 2. The connecting member 2 is preferably, for example, a metal screw.

In the multilayer substrate 103 according to the present preferred embodiment, since a portion of the metal member 23 is disposed inside the base material 10C, the metal member is firmly fixed to the base material as compared to a case in which the metal member is bonded to a conductor, provided on a surface of the base material, with a conductive bonding material such as solder, interposed therebetween. Thus, the metal member 23 is prevented from being detached from the multilayer substrate 103 by stress added in the metal member 23 when the multilayer substrate 103 is fixed to the metal housing 81, thus improving mechanical strength and electrical reliability.

In the present preferred embodiment, although the multilayer substrate is fixed to the metal housing 81 by the connecting member 2 defined by a metal screw, the present invention is not limited to this configuration. The connecting member 2 may be a clip or other suitable connector, and the multilayer substrate may be fixed to the metal housing by, for example, sandwiching the metal member exposed from the base material. The multilayer substrate may be connected to a mounting substrate or other structure provided in the metal housing 81 of the electronic device 201.

Fourth Preferred Embodiment

A fourth preferred embodiment of the present invention shows an example in which the shape of a metal member is different from that of the metal member according to the above preferred embodiments.

Figure 10A:
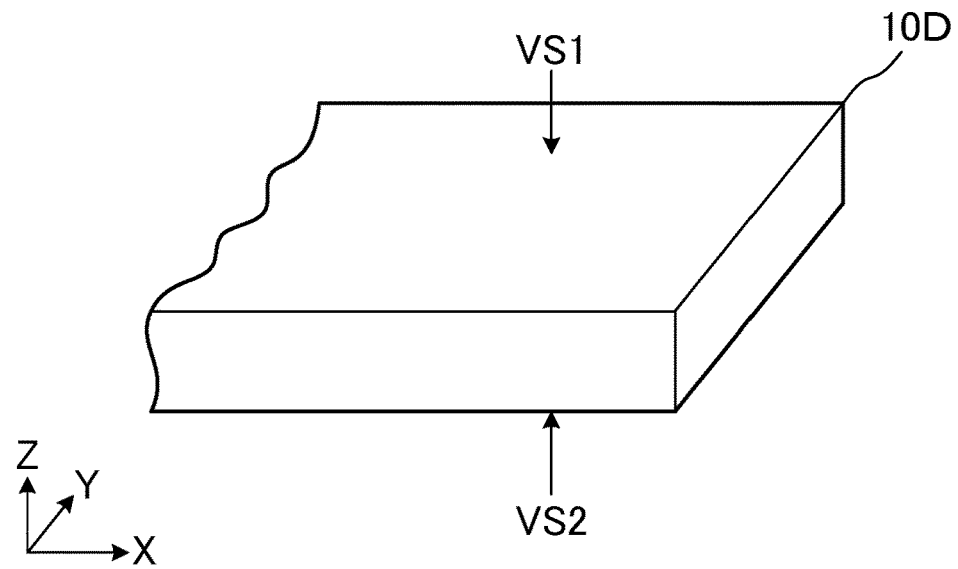
FIG. 10A is an external perspective view of a main portion of a multilayer substrate 104A according to a fourth preferred embodiment of the present invention.
Figure 10B:
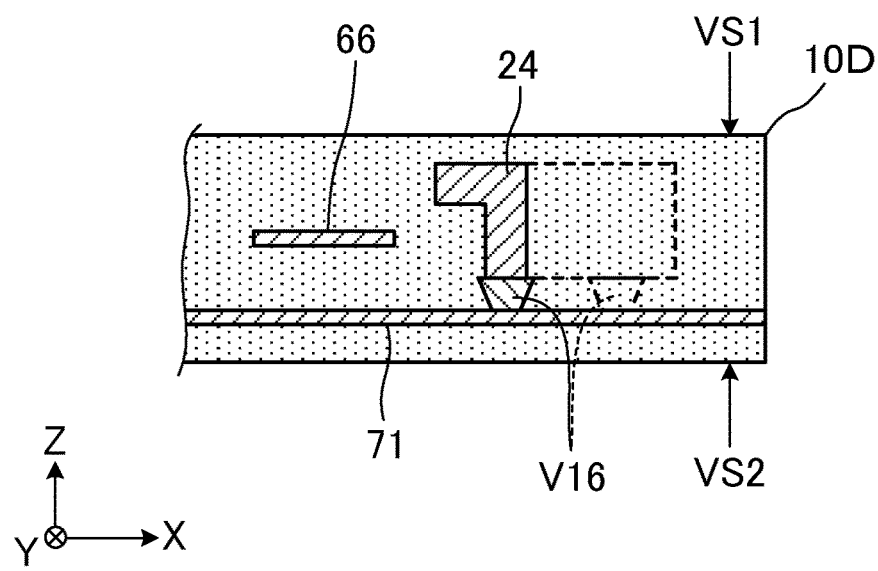
FIG. 10B is a cross-sectional view of the main portion of the multilayer substrate 104A.
Figure 11:
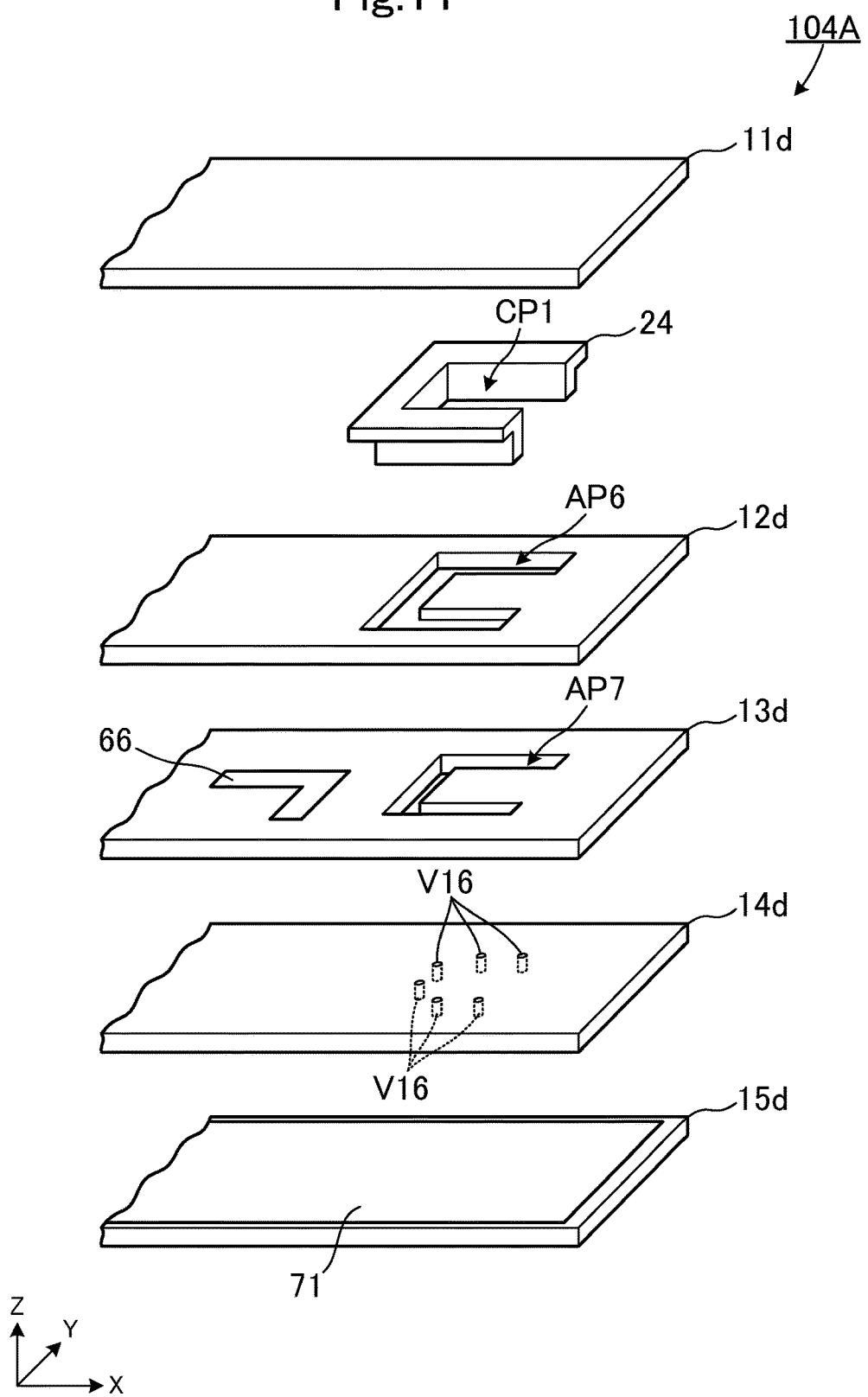
FIG. 11 is an exploded perspective view of the main portion of the multilayer substrate 104A.

FIG. 10A is an external perspective view of a main portion of a multilayer substrate 104A according to the fourth preferred embodiment, and FIG. 10B is a cross-sectional view of the main portion of the multilayer substrate 104A. FIG. 11 is an exploded perspective view of the main portion of the multilayer substrate 104A.

The multilayer substrate 104A according to the fourth preferred embodiment is different from the multilayer substrate 101 according to the first preferred embodiment in the shape of the metal member. The multilayer substrate 104A is different from the multilayer substrate 101 in that the multilayer substrate 104A includes a conductor 66. Other configurations are the same or substantially the same as those of the multilayer substrate 101. Hereinafter, portions different from the multilayer substrate 101 according to the first preferred embodiment will be described.

As shown in FIG. 10B, the multilayer substrate 104A includes a base material 10D, a metal member 24, and the like. The conductor 66, interlayer connection conductors V16, a ground conductor 71, and the like are provided inside the base material 10D.

The metal member 24 preferably has a U-shape as viewed from the thickness direction (Z-axis direction) and has a three-dimensional structure in which a portion extending in the planar direction (X-axis direction and Y-axis direction) and a portion extending in the thickness direction (Z-axis direction) are integrated with a bent portion interposed therebetween. The metal member 24 includes an opening portion CP1. As shown in FIG. 10B, the metal member 24 is disposed inside the base material 10D. One end of the metal member 24 is connected to the ground conductor 71 with the interlayer connection conductors V16 interposed therebetween.

As shown in FIG. 11, the base material 10D is formed by stacking insulating base material layers 11d, 12d, 13d, 14d, and 15d in the thickness direction (Z-axis direction) and heating and pressing stacked the insulating base material layers 11d, 12d, 13d, 14d, and 15d. The insulating base material layer 11d is an uppermost layer, and the insulating base material layer 15d is a lowermost layer.

An opening AP6 is provided in the insulating base material layer 12d. The opening AP6 has a U-shaped planar shape and is a through hole extending from an upper surface to the lower surface of the insulating base material layer 12d.

A conductor 66 preferably having an L-shaped planar shape is provided on an upper surface of the insulating base material layer 13d. On the other hand, an opening AP7 is provided in the insulating base material layer 13d. The opening AP7 preferably has a U-shaped planar shape and is a through hole extending from the upper surface to the lower surface of the insulating base material layer 13d.

In the insulating base material layer 14d, the five interlayer connection conductors V16 are provided. The five interlayer connection conductors V16 are preferably arranged in a U-shape in plan view of the insulating base material layer 14d (as viewed from the Z-axis direction).

On an upper surface of the insulating base material layer 15d, a ground conductor 71 is provided.

The base material 10D is formed preferably by stacking the insulating base material layers 11d, 12d, 13d, 14d, and 15d and heating and pressing stacked the insulating base material layers 11d, 12d, 13d, 14d, and 15d. At this time, by stacking the insulating base material layers 12d and 13d respectively including the openings AP6 and AP7 and the insulating base material layers 11d and 14d without openings, a cavity is formed inside the stacked insulating base material layers 11d, 12d, 13d, 14d, and 15d. This cavity extends in the thickness direction (Z-axis direction) and the planar direction (X-axis direction or Y-axis direction) so as to correspond to the shape of the metal member 24. The metal member 24 is provided (buried) in this cavity.

Figure 12A:
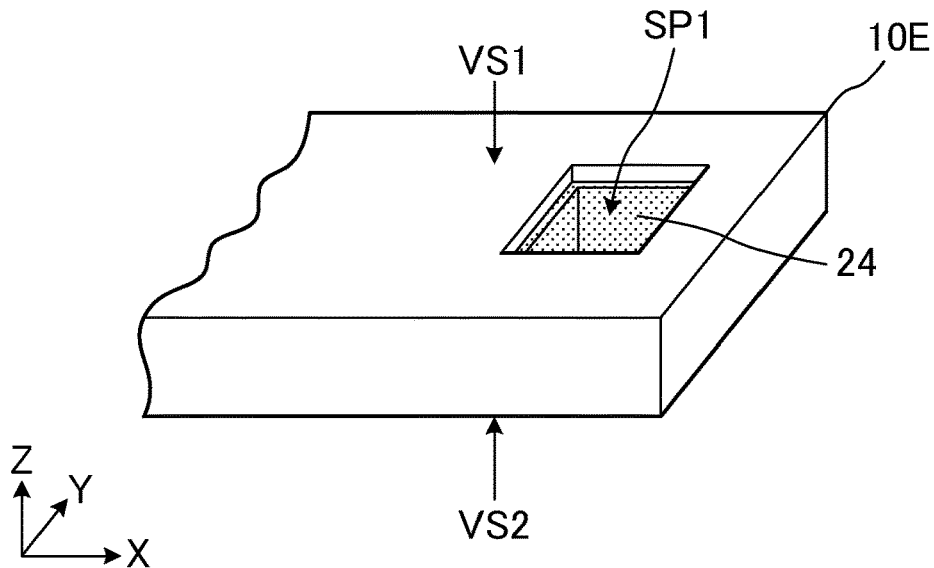
FIG. 12A is an external perspective view of a main portion of another multilayer substrate 104B according to the fourth preferred embodiment of the present invention.
Figure 12B:
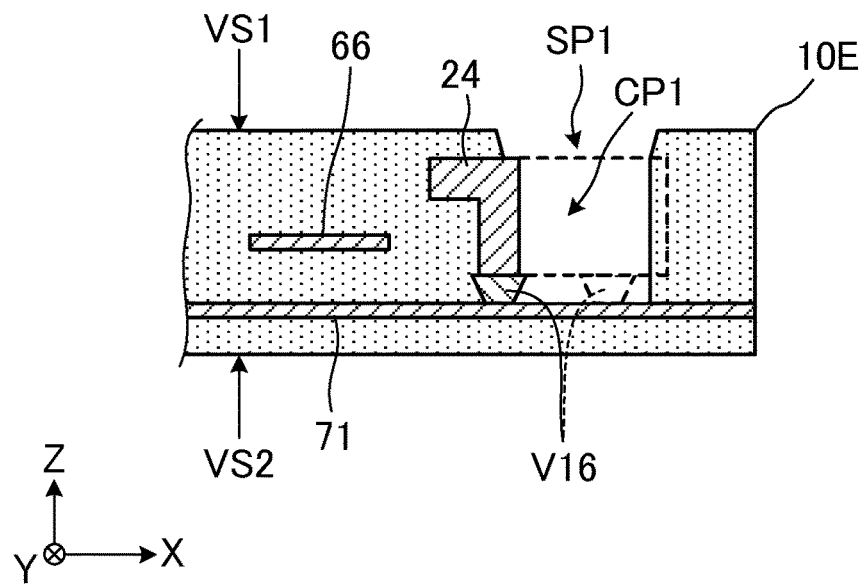
FIG. 12B is a cross-sectional view of the main portion of the multilayer substrate 104B.

Next, another multilayer substrate according to the present preferred embodiment will be described with reference to the drawings. FIG. 12A is an external perspective view of a main portion of another multilayer substrate 104B according to the fourth preferred embodiment, and FIG. 12B is a cross-sectional view of the main portion of the multilayer substrate 104B. In FIG. 12A, in order to make the structure easy to understand, the metal member 24 is indicated by a dot pattern.

As shown in FIGS. 12A and 12B, the multilayer substrate 104B includes a base material 10E, the metal member 24, and the like. The multilayer substrate 104B is different from the multilayer substrate 104A in that the multilayer substrate 104B includes a hole SP1 extending from a surface (first principal surface VS1) of the base material 10E towards the inside. Other configurations preferably are the same or substantially the same as those of the multilayer substrate 104A.

The hole SP1 is a hole extending in the thickness direction (Z-axis direction) from the first principal surface VS1 towards the inside of the base material 10E and extending to the ground conductor 71 provided inside the base material 10E. Thus, a portion of the ground conductor 71 is exposed from the base material 10E. The hole SP1 is disposed at a position corresponding to the opening portion CP1 of the metal member 24 (a portion where three directions (−X direction, +Y direction, and −Y direction) are surrounded by the metal member 24 in FIG. 11) as viewed from the Z-axis direction. Thus, the hole SP1 is provided along the opening portion CP1 of the metal member 24, and an inner portion of the opening portion CP1 of the metal member 24 is exposed from the base material 10E.

Figure 13:
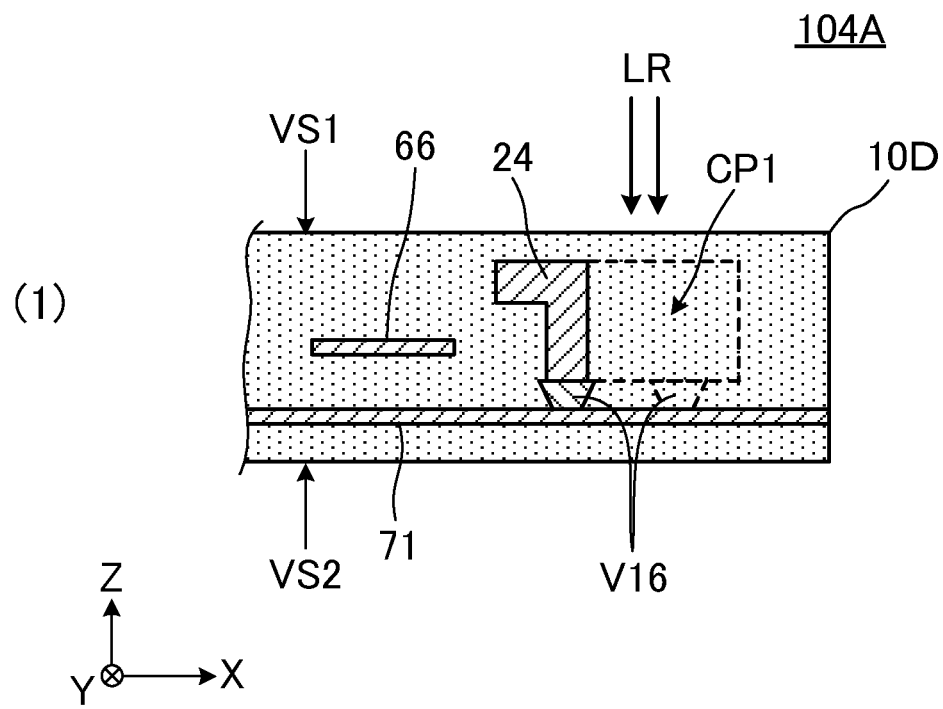
FIG. 13 is a cross-sectional view sequentially showing a process of manufacturing the multilayer substrate 104B.
Figure 13:
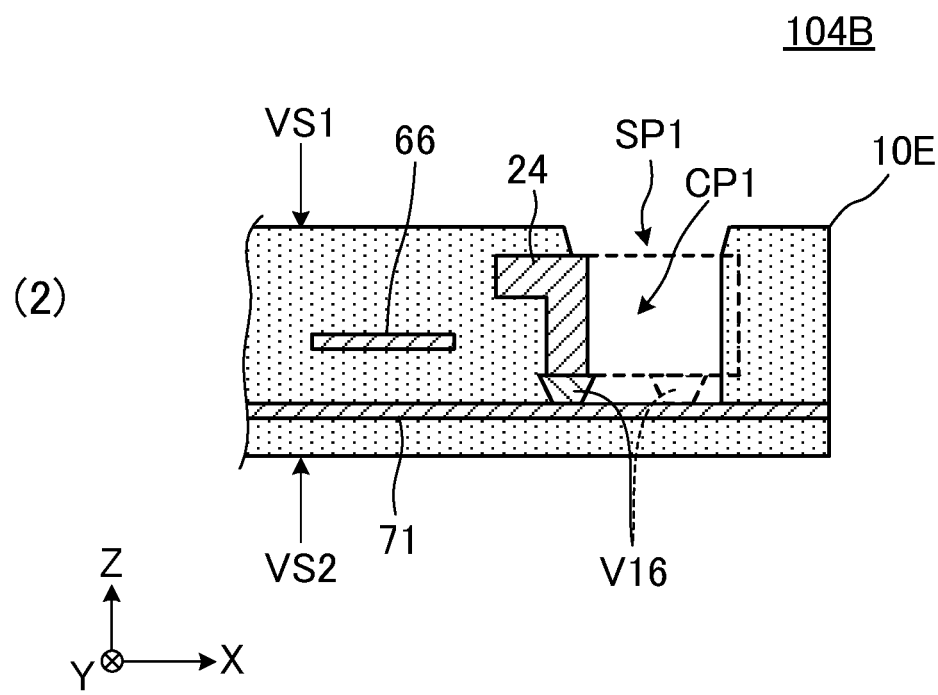

The multilayer substrate 104B according to the present preferred embodiment is manufactured by, for example, the following process. FIG. 13 is a cross-sectional view sequentially showing a process of manufacturing the multilayer substrate 104B.

First, as shown in (1) in FIG. 13, the multilayer substrate 104A is prepared.

Then, the hole SP1 extending in the thickness direction (Z-axis direction) from the first principal surface VS1 towards the inside of the base material 10D and extending the ground conductor 71 is formed to obtain the multilayer substrate 104B (base material 10E).

Specifically, the hole SP1 is preferably formed by a laser beam LR radiated toward the thickness direction (Z-axis direction) with respect to the position of the opening portion CP1 of the metal member 24 disposed inside the base material 10D. The laser beam LR is shielded by the ground conductor 71 located inside the base material 10D. By using such a manufacturing method, it is possible to easily form the hole SP1 extending from the first principal surface VS1 to the ground conductor 71. According to this manufacturing method, it is possible to prevent the hole from spreading into unnecessary portions (for example, in the X-direction with respect to the metal member 24) when forming the hole SP1 along the metal member 24.

In the multilayer substrate 104B according to the present preferred embodiment, although the hole SP1 extending from the first principal surface VS1 to the ground conductor 71 is preferably provided, the present invention is not limited to this configuration. The hole SP1 may not extend from the surface of the base material to the ground conductor. Further, the hole SP1 may be provided in a second principal surface VS2 or a side surface of the base material.

In the multilayer substrate 104B, although the hole SP1 is preferably disposed at the position corresponding to the opening portion CP1 of the metal member 24 as viewed from the Z-axis direction, the present invention is not limited to this configuration. The hole SP1 may be disposed at a position other than the opening portion CP1 of the metal member 24.

In the present preferred embodiment, although the metal member 24 is preferably a U-shaped three-dimensional structure as viewed from the thickness direction (Z-axis direction), the present invention is not limited to this configuration. As will be described in detail later (see "Other Preferred Embodiments"), the shape (three-dimensional structure) of the metal member may be appropriately changed within the scope of producing the operational effects of the present invention, and may be, for example, a shape bent into a substantially U-shape, a substantially L-shape, a substantially I-shape, a substantially T-shape, a substantially Y-shape, or other suitable shapes, for example, as viewed from the thickness direction (Z-axis direction).

Fifth Preferred Embodiment

A fifth preferred embodiment of the present invention shows an example in which the shape of a metal member is different from that of the metal member according to the above preferred embodiments.

Figure 14:
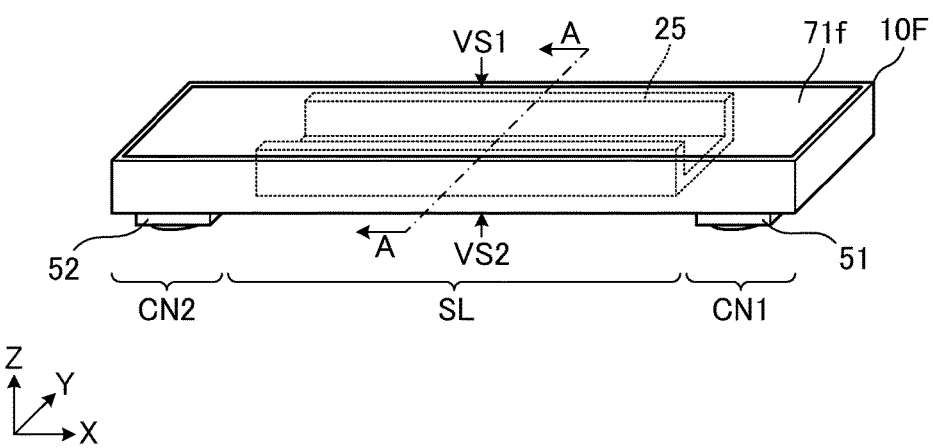
FIG. 14 is an external perspective view of a multilayer substrate 105 according to a fifth preferred embodiment of the present invention.
Figure 15:
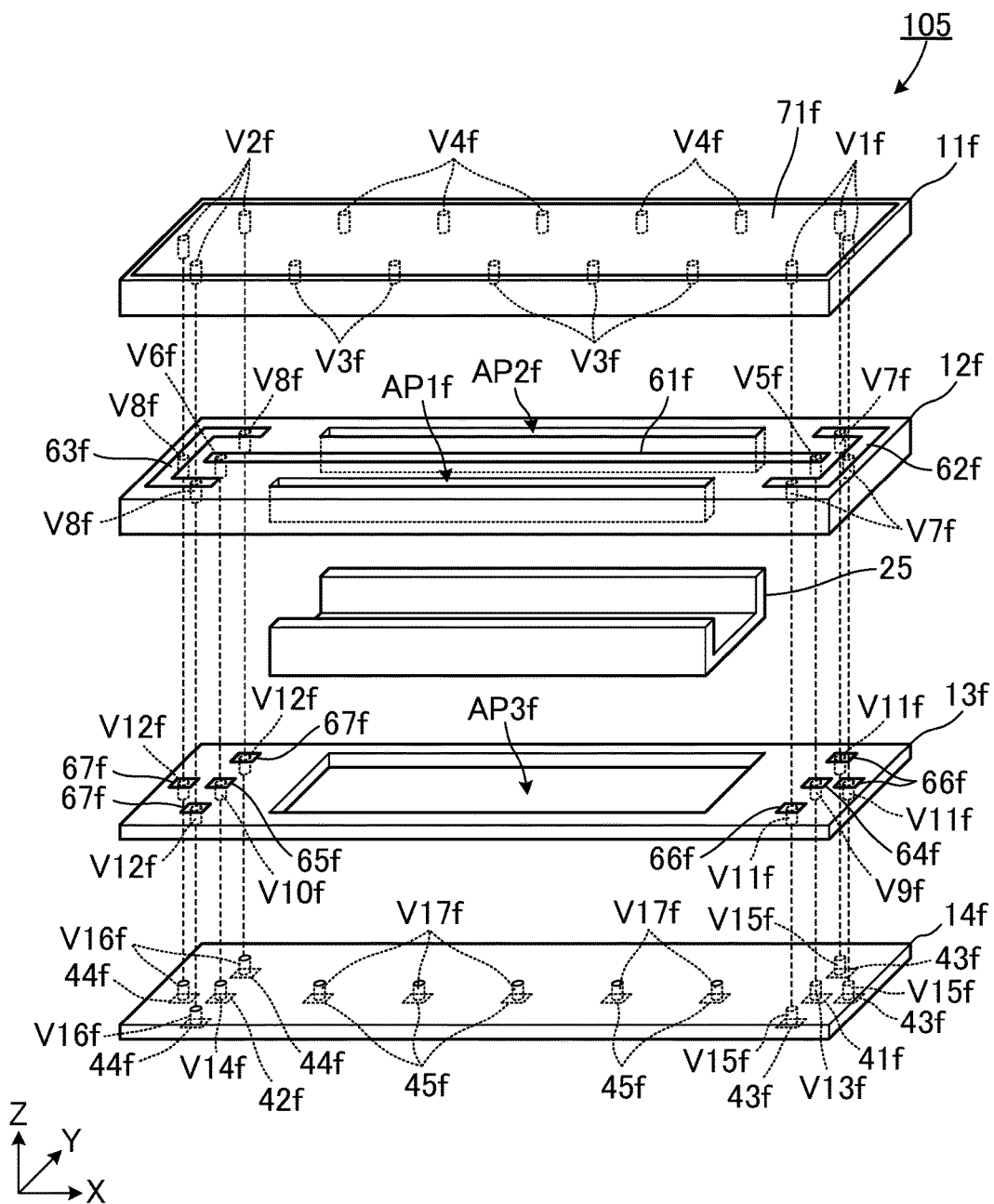
FIG. 15 is an exploded perspective view of the multilayer substrate 105.
Figure 16:
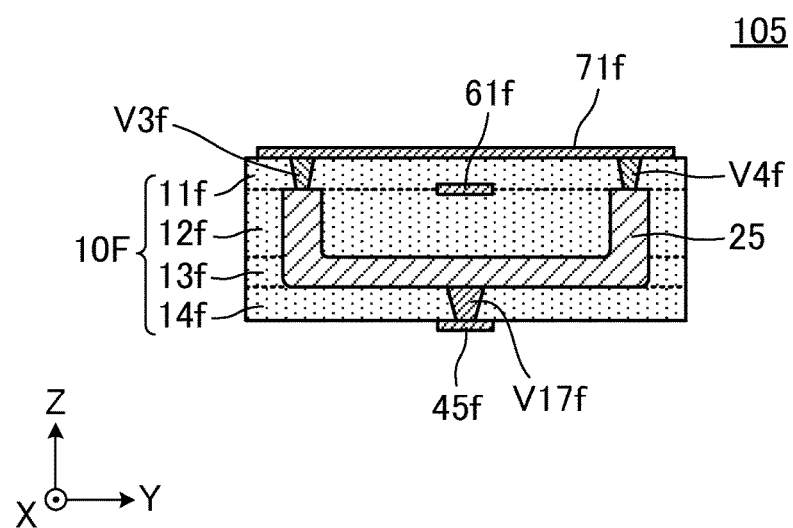
FIG. 16 is an A-A cross-sectional view of FIG. 14.

FIG. 14 is an external perspective view of a multilayer substrate 105 according to the fifth preferred embodiment. FIG. 15 is an exploded perspective view of the multilayer substrate 105. FIG. 16 is an A-A cross-sectional view of FIG. 14.

The multilayer substrate 105 preferably includes a base material 10F including a first principal surface VS1 and a second principal surface VS2 facing the first principal surface VS1, a metal member 25, connectors 51 and 52, and the like. The metal member 25 is provided (buried) inside the base material 10F. The connectors 51 and 52 are mounted on the second principal surface VS2 of the base material 10F. As shown in FIG. 14, the multilayer substrate 105 includes a line portion SL and connecting portions CN1 and CN2.

The base material 10F is a substantially elongated insulator flat plate whose longitudinal direction coincides or substantially coincides with the horizontal direction (X-axis direction in FIG. 14), and short-side direction coincides or substantially coincides with the vertical direction (Y-axis direction). The base material 10F is formed preferably by stacking insulating base material layers 11f, 12f, 13f, and 14f, each preferably made of a thermoplastic resin, for example, in the thickness direction (Z-axis direction in FIG. 15) and heating and pressing stacked the insulating base material layers 11f, 12f, 13f, and 14f. The insulating base material layers 11f, 12f, 13f, and 14f are flat plates each preferably having a rectangular or substantially rectangular planar shape.

The insulating base material layer 11f is an uppermost layer. On an upper surface of the insulating base material layer 11f, a ground conductor 71f is provided. The ground conductor 71f is a conductor pattern provided on almost the entire surface of the insulating base material layer 11f and preferably having a rectangular or substantially rectangular planar shape.

On an upper surface of the insulating base material layer 12f, a signal conductor 61f and conductors 62f, 63f are provided. The signal conductor 61f is preferably a linear (I-shaped) conductor pattern extending in the longitudinal direction (X-axis direction) of the insulating base material layer 12f and is disposed at the center in the short-side direction (Y-axis direction) of the insulating base material layer 12f. The conductor 62f is preferably a C-shaped conductor pattern and is disposed near one end (the right side end of the insulating base material layer 12f in FIG. 15) in the longitudinal direction (X-axis direction) of the insulating base material layer 12f. The conductor 62f is connected to the ground conductor 71f with three interlayer connection conductors Vhf provided in the insulating base material layer 11f, interposed therebetween. The conductor 63f is preferably a C-shaped conductor pattern and is disposed near the other end (the left side end of the insulating base material layer 12f) in the longitudinal direction (X-axis direction) of the insulating base material layer 12f. The conductor 63f is connected to the ground conductor 71f with three interlayer connection conductors V2f provided in the insulating base material layer 11f, interposed therebetween.

Openings AP1f and AP2f are provided in the insulating base material layer 12f. The opening AP1f is a through hole disposed closer to a first side (a lower side of the insulating base material layer 12f in FIG. 15) of the insulating base material layer 12f and preferably having a linear (I-shaped) planar shape extending in the longitudinal direction (X-axis direction) of the insulating base material layer 12f. The opening AP2f is a through hole disposed closer to a second side (an upper side of the insulating base material layer 12f) of the insulating base material layer 12f and preferably having a linear (I-shaped) planar shape extending in the longitudinal direction (X-axis direction) of the insulating base material layer 12f.

On an upper surface of the insulating base material layer 13f, conductors 64f and 65f, three conductors 66f, and three conductors 67f are provided. The conductors 64f and 65f, the three conductors 66f, and the three conductors 67f are conductor patterns each preferably having a rectangular or substantially rectangular planar shape. The conductor 64f and the three conductors 66f are located near one end of the insulating base material layer 13f (the right side end of the insulating base material layer 13f in FIG. 15). The conductor 65f and the three conductors 67f are located near the other end of the insulating base material layer 13f (the left side end of the insulating base material layer 13f).

The conductor 64f is connected to one end of the signal conductor 61f with an interlayer connection conductor V5f provided in the insulating base material layer 12f, interposed therebetween. The conductor 65f is connected to the other end of the signal conductor 61f with an interlayer connection conductor V6f provided in the insulating base material layer 12f, interposed therebetween. The three conductors 66f are each connected to the conductor 62f with interlayer connection conductors V7f, provided in the insulating base material layer 12f, interposed therebetween. The three conductors 67f are each connected to the conductor 63f with an interlayer connection conductors V8f provided in the insulating base material layer 12f, interposed therebetween.

An opening AP3f is provided in the insulating base material layer 13f. The opening AP3f is disposed at the center or approximate center of the insulating base material layer 13f and is a through hole whose longitudinal direction coincides or substantially coincides with the horizontal direction (X-axis direction) and preferably having a rectangular or substantially rectangular planar shape.

The insulating base material layer 14f is a lowermost layer. On a lower surface of the insulating base material layer 14f, signal electrodes 41f and 42f, three ground electrodes 43f, three ground electrodes 44f, and five ground electrodes 45f are provided. The signal electrodes 41f and 42f, the three ground electrodes 43f, the three ground electrodes 44f, and the five ground electrodes 45f are conductor patterns each preferably have a rectangular or substantially rectangular planar shape. The signal electrode 41f and the three ground electrodes 43f are located near one end of the insulating base material layer 14f (the right side end of the insulating base material layer 14f in FIG. 15). The signal electrode 42f and the three ground electrodes 44f are located near the other end of the insulating base material layer 14f (the left side end of the insulating base material layer 14f). The five ground electrodes 45f are located at the center or approximate center in the short-side direction (Y-axis direction) of the insulating base material layer 14f and aligned in the longitudinal direction (X-axis direction).

The signal electrode 41f is connected to the conductor 64f with interlayer connection conductor V9f provided in the insulating base material layer 13f and inter layer connection conductor V13f provided in the insulating base material layers 13f and 14f, interposed therebetween. The signal electrode 42f is connected to the conductor 65f with the interlayer connection conductor V10f provided in the insulating base material layer 13f and interlayer connection conductor V14f provided in the insulating base material layer 14f, interposed therebetween. The three ground electrodes 43f are connected respectively to the three conductors 66f with interlayer connection conductors V11f provided in the insulating base material layer 13f and interlayer connection conductor V15f provided in the insulating base material layer 14f, interposed therebetween. The three ground electrodes 44f are connected respectively to the three conductors 67f with interlayer connection conductors V12f provided in the insulating base material layer 13f and interlayer connection conductor V16f provided in the insulating base material layer 14f, interposed therebetween.

As described above, the base material 10F is formed preferably by stacking the insulating base material layers 11f, 12f, 13f, and 14f and heating and pressing stacked the insulating base material layers 11f, 12f, 13f, and 14f. At this time, by stacking the insulating base material layers 12f and 13f respectively including the openings AP1f, AP2f, and AP3f and the insulating base material layers 11f and 14f without an opening, a cavity is formed inside the stacked insulating base material layers 11f, 12f, 13f, and 14f. This cavity extends in the thickness direction (Z-axis direction) and the planar direction (X-axis direction or Y-axis direction) so as to correspond to the shape of the metal member 25. The metal member 25 is provided (buried) in this cavity.

The metal member 25 is a three-dimensional structure including a portion extending in the thickness direction (Z-axis direction) and a portion extending in the planar direction (X-axis direction or Y-axis direction) with a bent portion interposed between the portion extending in the thickness direction and the portion extending in the planar direction to define an integrated unitary monolithic structure. More specifically, the metal member 25 extends in the horizontal direction (X-axis direction) and having a C-shaped cross section and is the member in which a portion extending in the thickness direction (Z-axis direction) and a portion extending in the planar direction (Y-axis direction) are integrated.

The metal member 25 is obtained by, for example, shaping a copper flat plate by plastic deformation (e.g., forging). The metal member 25 may be shaped to have a three-dimensional structure by casting, for example. The thickness of the metal member 25 is larger than the thickness of the conductor pattern (the electrode and the conductor provided on the insulating base material layer), and the metal member 25 is a more rigid (harder) member than the base material 10F.

As shown in FIGS. 15 and 16, the metal member 25 is connected to the ground conductor 71*f* with interlayer connection conductors V3*f* and V4*f* provided in the insulating base material layer 11*f*, interposed therebetween. Further, the metal member 25 is connected respectively to the five ground electrodes 45*f* with interlayer connection conductors V17*f* provided in the insulating base material layer 14*f*, interposed therebetween. As shown in FIG. 16, the metal member 25 surrounds three directions (+Y direction, −Y direction, and −X direction) of the signal conductor 61*f*.

The signal electrodes 41*f* and 42*f* and the ground electrodes 43*f*, 44*f*, and 45*f* are exposed on the second principal surface VS2 of the base material 10F. The connector 51 is electrically connected (bonded) to the signal electrode 41*f* and the three ground electrodes 43*f*, respectively, and the connector 52 is electrically connected (bonded) to the signal electrode 42*f* and the three ground electrodes 44*f*, respectively.

As described above, a transmission line including the signal conductor 61*f*, the metal member 25 disposed so as to surround the three directions of the signal conductor 61*f*, the ground conductor 71*f*, and the interlayer connection conductors V3*f* and V4*f* is provided. Specifically, in the base material 10F of the multilayer substrate 105, a transmission line in which the signal conductor 61*f* is surrounded in four directions (+Y direction, −Y direction, +X direction, and −X direction) by the ground (the metal member 25 and the ground conductor 71*f*) is provided. As shown in FIG. 16, in the present preferred embodiment, a planar metal (a portion of the metal member 25) extending in the thickness direction (Z-axis direction) and the longitudinal direction (X-axis direction) of the base material 10F is disposed on both sides in the width direction (Y-axis direction) of the signal conductor 61*f*. Thus, as compared to the structure in which the interlayer connection conductors are arranged on both sides in a width direction (Y-axis direction) of the signal conductor, unnecessary radiation from the transmission line to the outside is reduced or prevented.

In the present preferred embodiment, as shown in FIG. 14, the metal member 25 which is more rigid (harder) than the base material 10F is provided (buried) near the center or approximate center in the longitudinal direction (X-axis direction) of the base material 10F, so that the mechanical strength of the portion in which the metal member 25 is provided (buried) is increased. That is, in the present preferred embodiment, the metal member 25 is a deformation preventing member defining and functioning as a ground.

Further, in the present preferred embodiment, the vicinity of the connecting portions CN1 and CN2 (one end and the other end in the longitudinal direction (X-axis direction) of the base material 10F) in which the metal member 25 is not provided (buried) has flexibility, so that the connectors 51 and 52 are easily connected (bonded) to a mounting substrate or other suitable structure.

In the present preferred embodiment, although the multilayer substrate 105 preferably has flexibility near the connecting portions CN1 and CN2 (one end and the other end in the longitudinal direction (X-axis direction) of the base material 10F) in which the metal member 25 is not provided (buried), the present invention is not limited to this configuration. With the arrangement of the metal member having higher rigidity than the base material 10F, it is possible to suitably change the portion having flexibility. Further, a metal member having high rigidity may be provided (buried) in the entire longitudinal direction (X-axis direction) of the base material.

As described above, it is preferable that the metal member 25 is made of the same material as the conductor pattern (the signal electrode, the signal conductor, the conductor, the ground conductor, and the ground electrode). With this configuration, since the metal member 25, the conductor pattern, and the interlayer connection conductor are simultaneously bonded by heat during heating and pressing (thermocompression bonding), the manufacturing process is simplified.

Sixth Preferred Embodiment

In a sixth preferred embodiment of the present invention, an example of an electronic device in which a multilayer substrate is mounted on a mounting substrate is described.

Figure 17A:
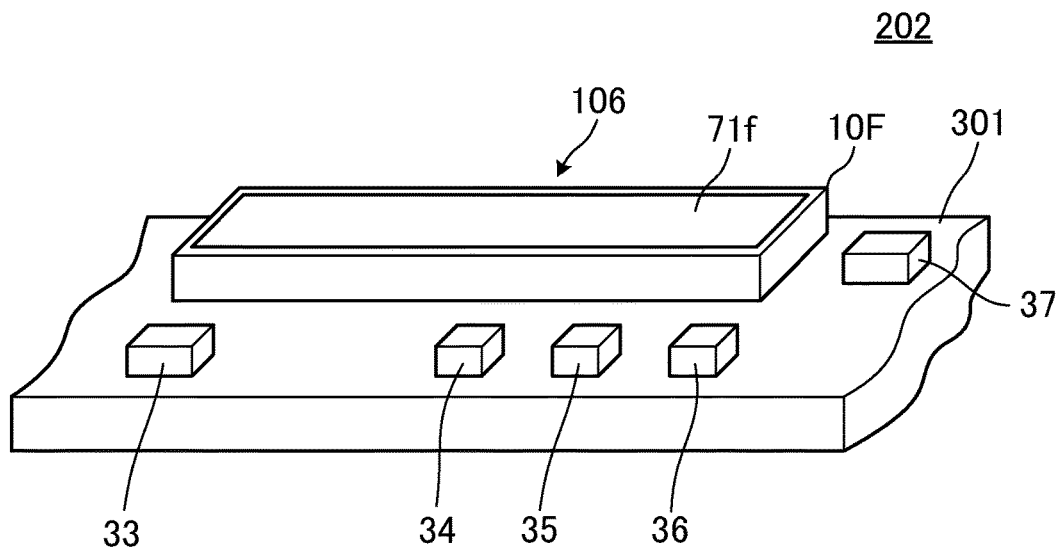
FIG. 17A is a perspective view showing a main portion of an electronic device 202 according to a sixth preferred embodiment of the present invention.
Figure 17B:
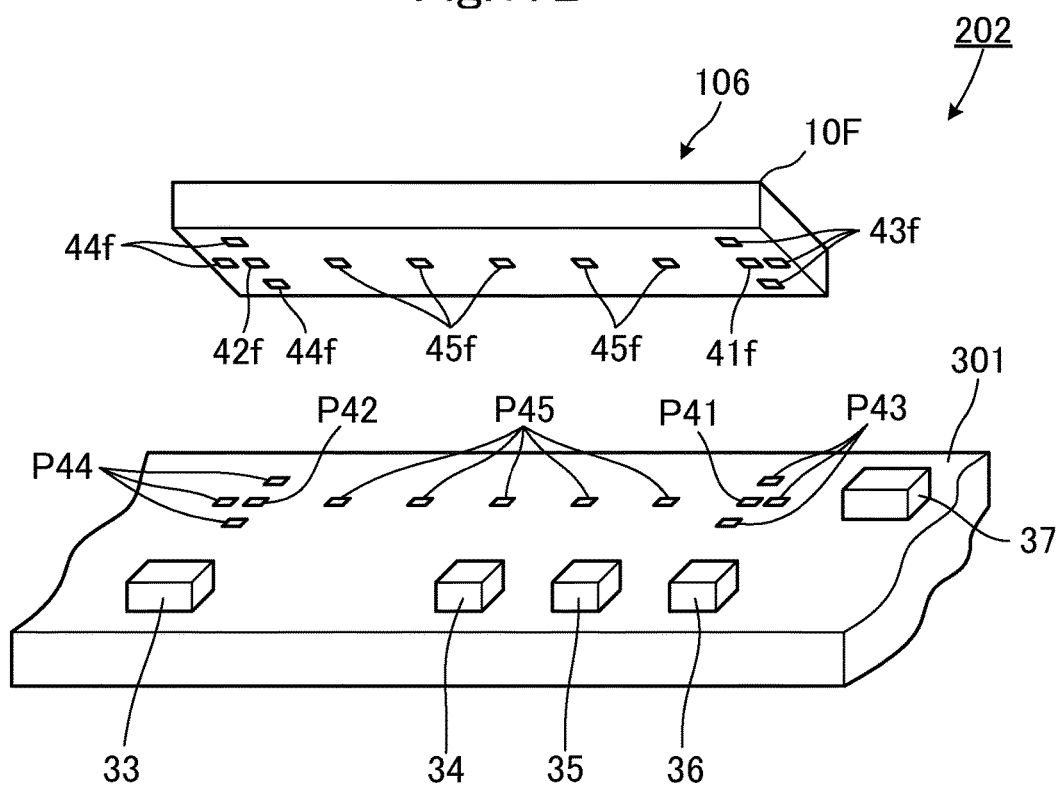
FIG. 17B is an exploded perspective view showing the main portion of the electronic device 202.

FIG. 17A is a perspective view showing a main portion of an electronic device 202 according to the sixth preferred embodiment, and FIG. 17B is an exploded perspective view showing the main portion of the electronic device 202.

The electronic device 202 according to the present preferred embodiment includes a mounting substrate 301, a multilayer substrate 106, mounting components 33, 34, 35, 36, and 37, and the like. The multilayer substrate 106 and the mounting substrate 301 are provided inside a housing (not shown). The multilayer substrate 106 is different from the multilayer substrate 105 according to the fifth preferred embodiment in that the multilayer substrate 106 does not include a connector, and other configurations are the same or substantially the same as those of the multilayer substrate 105.

The multilayer substrate 106 according to the present preferred embodiment is mounted on the mounting substrate 301 by using a conductive bonding material, such as solder, and connected to a circuit provided in contact with the mounting substrate 301. In addition, the mounting components 33, 34, 35, 36, and 37 and the like are mounted on the mounting substrate 301. The mounting substrate 301 is preferably, for example, a printed wiring board. The mounting components 33, 34, 35, 36, and 37 are preferably, for example, chip components, such as a chip inductor and a chip capacitor made of a ceramic material.

As shown in FIG. 17B, the signal electrodes 41*f* and 42*f* of the multilayer substrate 106 are connected respectively to electrodes P41 and P42 provided on the mounting substrate 301. Three ground electrodes 43*f* of the multilayer substrate 106 are connected respectively to three ground electrodes P43 provided on the mounting substrate 301. Three ground electrodes 44*f* of the multilayer substrate 106 are connected respectively to three ground electrodes P44 provided on the mounting substrate 301. Five ground electrodes 45*f* of the multilayer substrate 106 are connected respectively to five ground electrodes P45 provided on the mounting substrate 301.

In this manner, the multilayer substrate may be mounted on the mounting substrate. As in the present preferred embodiment, by providing a metal member having higher rigidity than the base material 10F in the base material 10F, it is possible to reduce or prevent warping and unnecessary deformation of the multilayer substrate. Accordingly, even if the base material is long as in the multilayer substrate 106 according to the present preferred embodiment, surface mounting on a mounting substrate or the like is facilitated, and mounting of the multilayer substrate is possible by a mounting machine similarly to other components, so that the mounting process is simplified.

Seventh Preferred Embodiment

A seventh preferred embodiment of the present invention is an example of a multilayer substrate in which a transmission line having a structure different from that of the fifth preferred embodiment is provided.

Figure 18A:
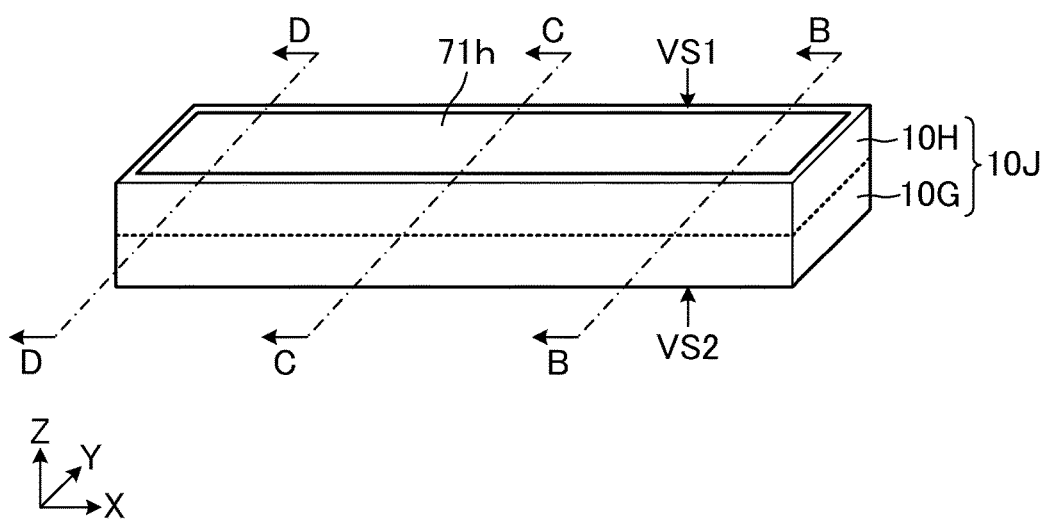
FIG. 18A is an external perspective view of a multilayer substrate 107 according to a seventh preferred embodiment of the present invention.
Figure 18B:
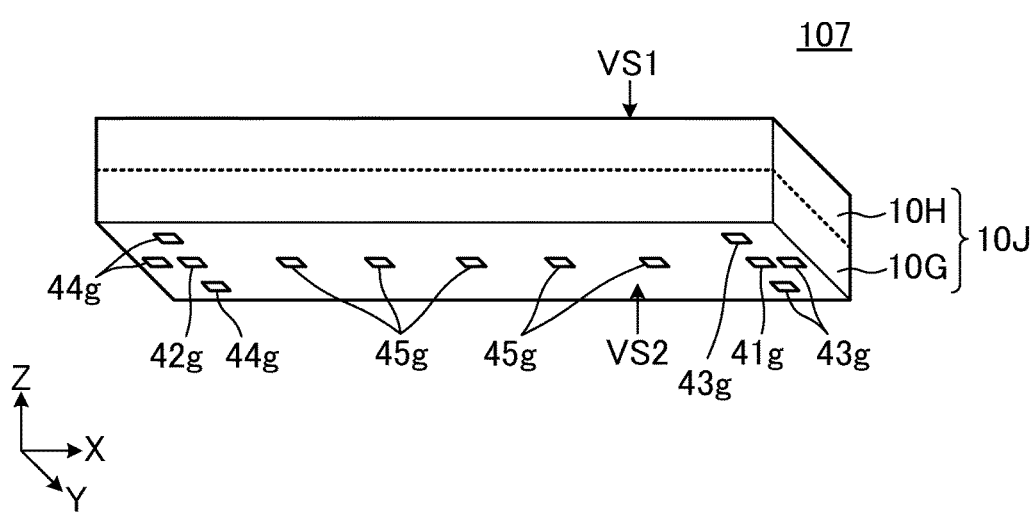
FIG. 18B is an external perspective view of the multilayer substrate 107 viewed from a different viewpoint from FIG. 18A.
Figure 19:
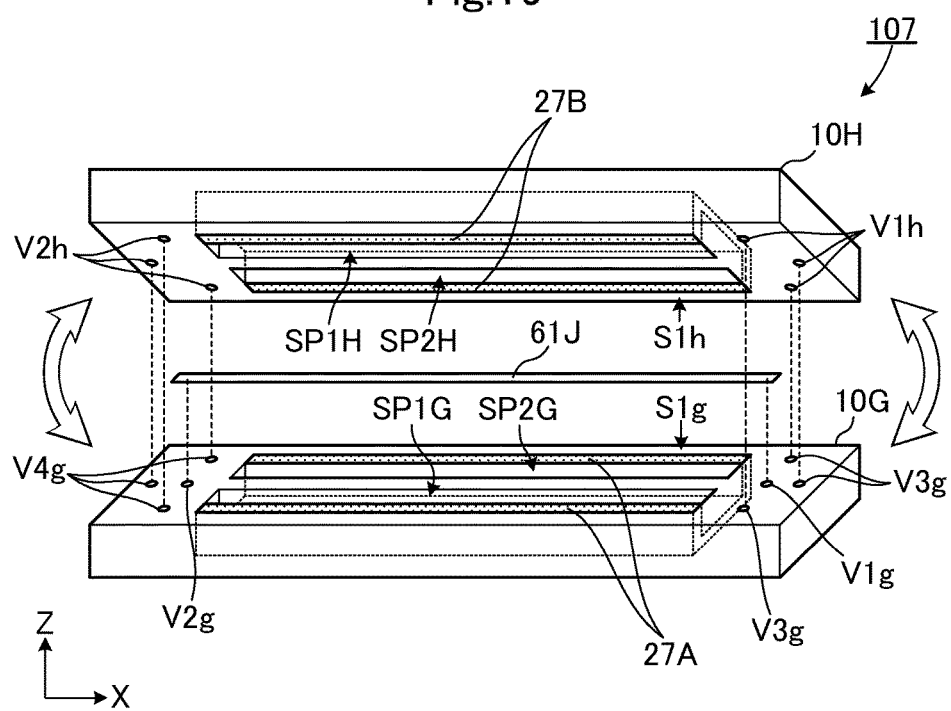
FIG. 19 is an exploded perspective view of the multilayer substrate 107.
Figure 20A:
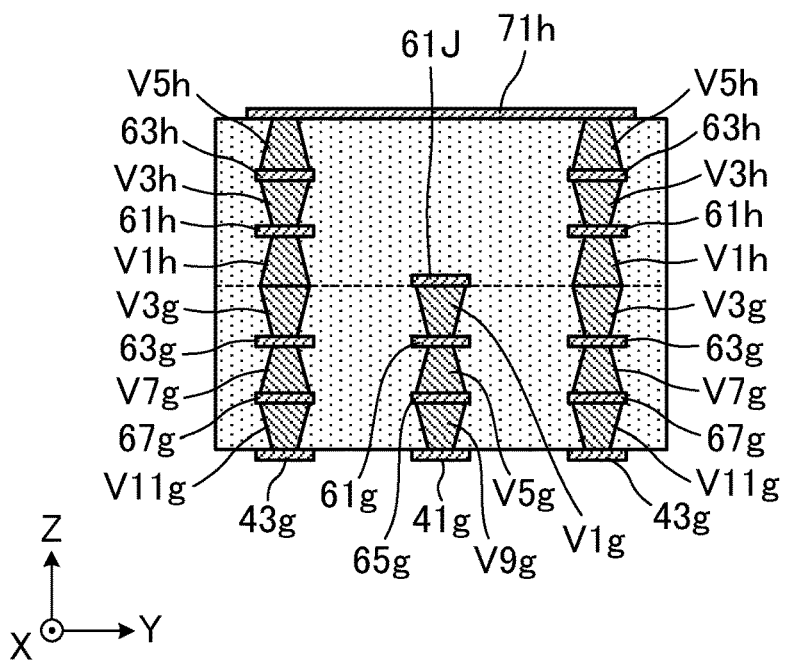
FIG. 20A is a B-B cross-sectional view of FIG. 18A.
Figure 20B:
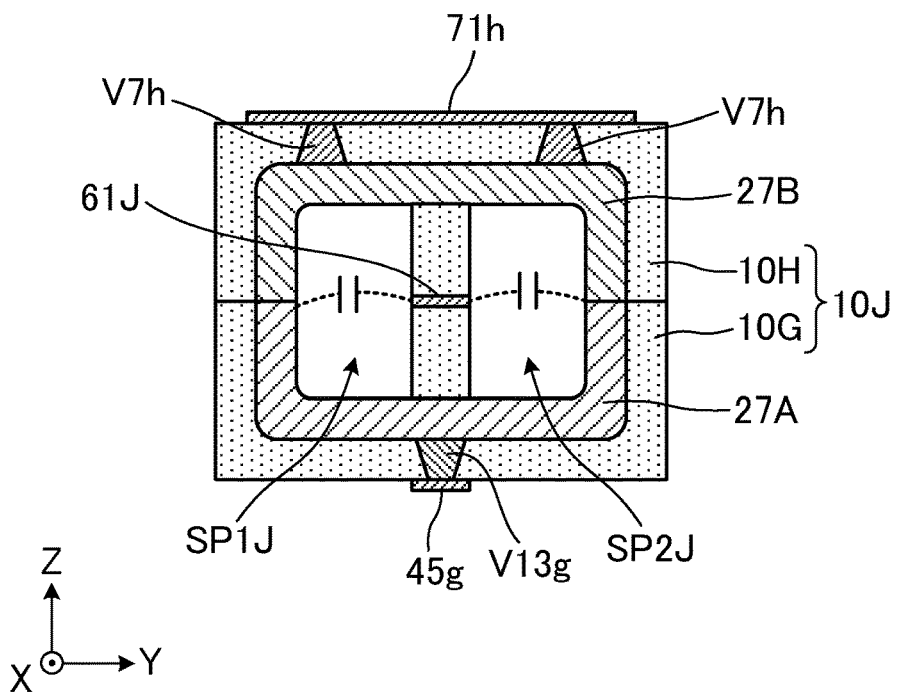
FIG. 20B is a C-C cross-sectional view of FIG. 18A.
Figure 21:
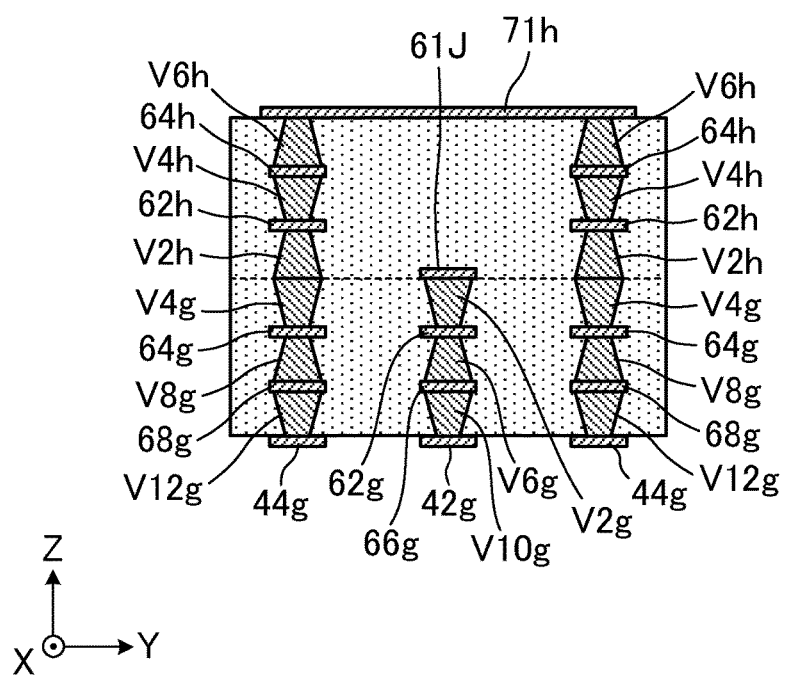
FIG. 21 is a D-D cross-sectional view of FIG. 18A.

FIG. 18A is an external perspective view of a multilayer substrate 107 according to the seventh preferred embodiment, and FIG. 18B is an external perspective view of the multilayer substrate 107 viewed from a different viewpoint from FIG. 18A. FIG. 19 is an exploded perspective view of the multilayer substrate 107. FIG. 20A is a B-B cross-sectional view of FIG. 18A, and FIG. 20B is a C-C cross-sectional view of FIG. 18A. FIG. 21 is a D-D cross-sectional view of FIG. 18A. In FIG. 19, in order to make the structure easy to understand, the metal members 27A and 27B are indicated by dot patterns.

The multilayer substrate 107 includes a base material 10J including a first principal surface VS1 and a second principal surface VS2 facing the first principal surface VS1, a signal conductor 61J, and the metal members 27A and 27B. The signal conductor 61J, the metal members 27A and 27B, and the like are provided (buried) inside the base material 10J.

The base material 10J is a substantially elongated insulator whose longitudinal direction coincides or substantially coincides with the horizontal direction (X-axis direction in FIGS. 18A and 18B), and short-side direction coincides or substantially coincides with the vertical direction (Y-axis direction). A ground conductor 71h is provided on almost the entire first principal surface VS1 of the base material 10J. On the second principal surface VS2 of the base material 10J, signal electrodes 41g and 42g, three ground electrodes 43g, and three ground electrodes 44g are provided. The signal electrode 41g and the three ground electrodes 43g are located near one end of the base material 10J (the right side end of the second principal surface VS2 of the base material 10J in FIG. 18B). The signal electrode 42g and the three ground electrodes 44g are located near the other end of the base material 10J (the left side end of the second principal surface VS2 of the base material 10J).

As shown in FIG. 19, the base material 10J is formed preferably by stacking a base material 10G and a base material 10H such that a first surface S1g of the base material 10G and a first surface S1h of the base material 10H are superposed with each other. The signal conductor 61J is preferably a linear (I-shaped) flat plate extending in the horizontal direction (X-axis direction). One end of the signal conductor 61J is connected to an interlayer connection conductor V1g exposed on the first surface S1g of the base material 10G. The other end of the signal conductor 61J is connected to an interlayer connection conductor V2g exposed on the first surface S1g of the base material 10G. The signal conductor 61J is bonded to the interlayer connection conductors V1g and V2g preferably by, for example, solder, a conductive adhesive, or other suitable bonding material.

As shown in FIG. 19, three interlayer connection conductors V3g exposed on the first surface S1g of the base material 10G are connected respectively to three interlayer connection conductors V1h exposed on the first surface S1h of the base material 10H. Three interlayer connection conductors V4g exposed on the first surface S1g of the base material 10G are connected respectively to three interlayer connection conductors V2h exposed on the first surface S1h of the base material 10H.

As shown in FIG. 20A, one end of the signal conductor 61J is connected to the signal electrode 41g with signal conductors 61g and 65g and interlayer connection conductors V1g, V5g, and V9g interposed therebetween. As shown in FIG. 21, the other end of the signal conductor 61J is connected to the signal electrode 42g with signal conductors 62g and 66g and interlayer connection conductors V2g, V6g, and V10g interposed therebetween. The three ground electrodes 43g and the three ground electrodes 44g are electrically connected to the ground conductor 71h with the ground conductors and the interlayer connection conductors interposed therebetween.

By stacking the base material 10G and the base material 10H, the metal member 27A exposed on the first surface S1g of the base material 10G is connected to the metal member 27B exposed on the first surface S1h of the base material 10H. As shown in FIG. 20B, the ground electrode 45g is electrically connected to the ground conductor 71h with the metal members 27A and 27B, and the interlayer connection conductors V13g and V7h interposed therebetween.

As shown in FIG. 20B, in the present preferred embodiment, a transmission line including the signal conductor 61J and the metal members 27A and 27B arranged so as to surround four directions (+Y direction, −Y direction, +Z direction, and −Z direction) of the signal conductor 61J is provided. Specifically, in the multilayer substrate 107, a transmission line in which the signal conductor 61J is surrounded by the ground (metal members 27A and 27B) is provided. Between the signal conductor 61J and the ground (metal members 27A and 27B), holes SP1J and SP2J including no insulating base material layer are provided as shown in FIG. 20B.

Figure 22A:
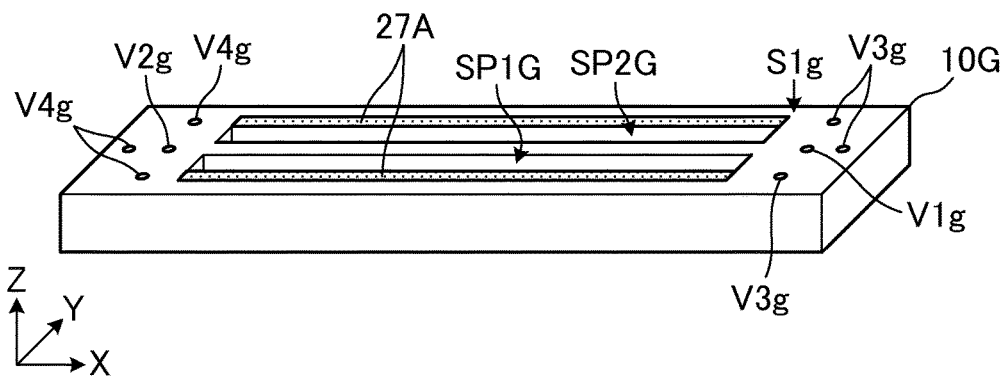
FIG. 22A is an external perspective view of a base material 10G.

Next, the structure of the base material 10G will be described with reference to the drawings. FIG. 22A is an external perspective view of the base material 10G, and FIG. 22B is an exploded perspective view of the base material 10G.

The base material 10G is a substantially elongated insulator flat plate whose longitudinal direction coincides or substantially coincides with the horizontal direction (X-axis direction), and short-side direction coincides or substantially coincides with the vertical direction (Y-axis direction). The metal member 27A is disposed inside the base material 10G.

Figure 22B:
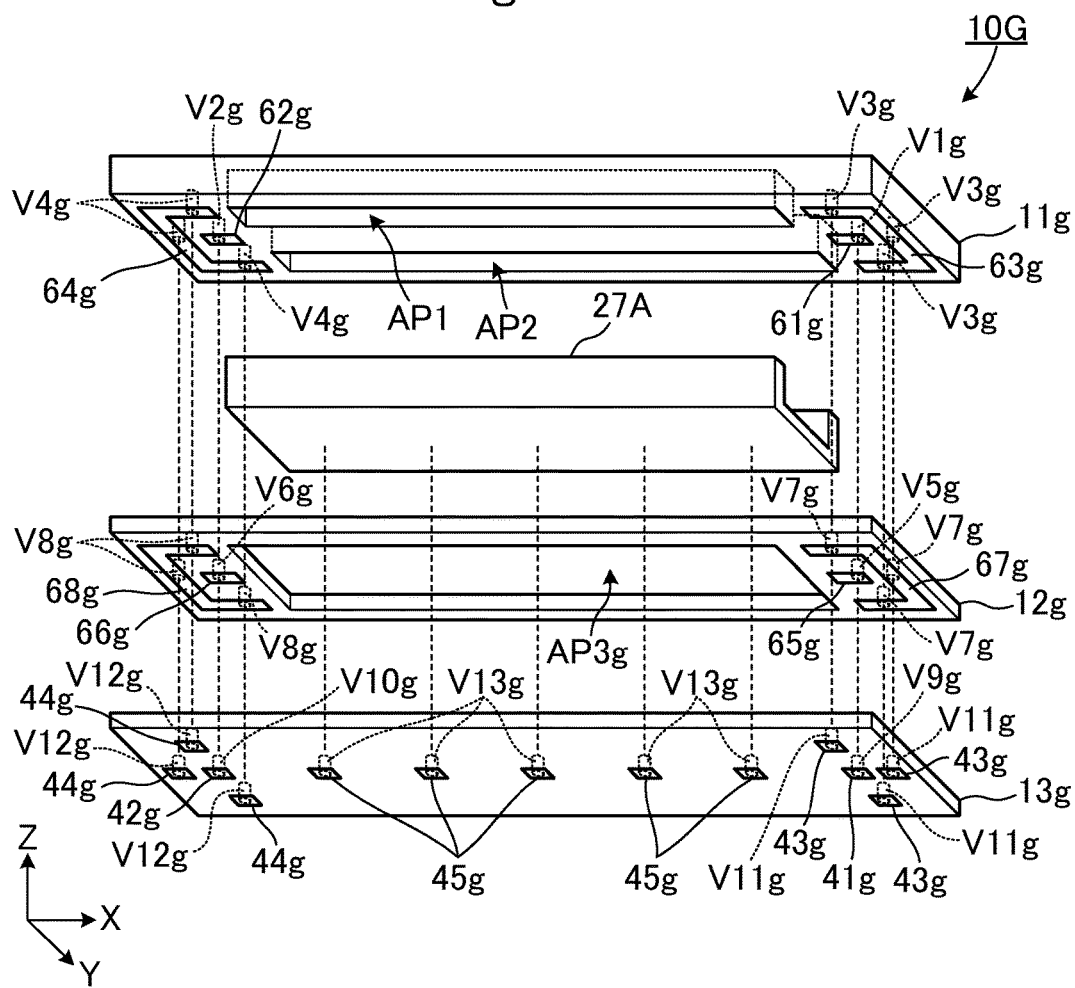
FIG. 22B is an exploded perspective view of the base material 10G.

As shown in FIG. 22B, the metal member 27A extends in the horizontal direction (X-axis direction) and having a C-shaped cross section and is the member in which a portion extending in the thickness direction (Z-axis direction) and a portion extending in the planar direction (Y-axis direction) are integrated to define a continuous unitary monolithic structure. The metal member 27A is preferably obtained by, for example, shaping a copper flat plate by plastic deformation (e.g., forging).

The base material 10G includes two holes SP1G and SP2G extending from the first surface S1g towards the inside. The holes SP1G and SP2G are holes extending in the thickness direction (Z-axis direction) from the first surface S1g towards the inside of the base material 10G and extending to the metal member 27A disposed inside the base material 10G. The holes SP1G and SP2G each preferably have a linear (I-shaped) planar shape extending in the horizontal direction (X-axis direction) and are aligned in the vertical direction (Y-axis direction). As shown in FIG. 21A, the holes SP1G and SP2G are provided along the metal member 27A.

The base material 10G is formed preferably by stacking insulating base material layers 11g, 12g, and 13g, each preferably made of a thermoplastic resin, for example, in the thickness direction (Z-axis direction) and heating and pressing stacked the insulating base material layers 11g, 12g, and 13g. The insulating base material layers 11g, 12g, and 13g are flat plates each preferably having a rectangular or substantially rectangular planar shape.

The insulating base material layer 11g is an uppermost layer. The signal conductors 61g and 62g and ground conductors 63g and 64g are provided on a lower surface of the insulating base material layer 11g. The signal conductors 61g and 62g are conductor patterns each preferably having a rectangular or substantially rectangular planar shape, and the ground conductors 63g and 64g are preferably C-shaped conductor patterns. The signal conductor 61g and the ground conductor 63g are located near one end (the right side end of the insulating base material layer 11g in FIG. 22B) in the longitudinal direction (X-axis direction) of the insulating base material layer 11g. The signal conductor 62g and the ground conductor 64g are located near the other end (the left side end of the insulating base material layer 11g) in the longitudinal direction (X-axis direction) of the insulating base material layer 11g.

The interlayer connection conductors V1g and V2g, the three interlayer connection conductors V3g, and the three interlayer connection conductors V4g are provided in the insulating base material layer 11g. The interlayer connection conductor V1g is connected to the signal conductor 61g, and the interlayer connection conductor V2g is connected to the signal conductor 62g. The three interlayer connection conductors V3g are connected to the ground conductor 63g, and the three interlayer connection conductors V4g are connected to the ground conductor 64g.

Openings AP1g and AP2g are provided in the insulating base material layer 11g. The opening AP1g is a through hole disposed closer to a first side (an upper side of the insulating base material layer 11g in FIG. 22B) of the insulating base material layer 11g and preferably having a linear (I-shaped) planar shape extending in the longitudinal direction (X-axis direction) of the insulating base material layer 11g. The opening AP2g is a through hole disposed closer to a second side (a lower side of the insulating base material layer 11g) of the insulating base material layer 11g and preferably having a linear (I-shaped) planar shape extending in the longitudinal direction (X-axis direction) of the insulating base material layer 11g.

The signal conductors 65g and 66g and ground conductors 67g and 68g are provided on a lower surface of the insulating base material layer 12g. The signal conductors 65g and 66g are conductor patterns each preferably having a rectangular or substantially rectangular planar shape, and the ground conductors 67g and 68g are conductor patterns each preferably having a C-shaped planar shape. The signal conductor 65g and the ground conductor 67g are located near one end (the right side end of the insulating base material layer 12g in FIG. 22B) in the longitudinal direction (X-axis direction) of the insulating base material layer 12g. The signal conductor 66g and the ground conductor 68g are located near the other end (the left side end of the insulating base material layer 12g) in the longitudinal direction (X-axis direction) of the insulating base material layer 12g.

The signal conductor 65g is connected to the signal conductor 61g with the interlayer connection conductor V5g provided in the insulating base material layer 12g, interposed therebetween. The signal conductor 66g is connected to the signal conductor 62g with the interlayer connection conductor V6g provided in the insulating base material layer 12g, interposed therebetween. The ground conductor 67g is connected to the ground conductor 63g with three interlayer connection conductors V7g provided in the insulating base material layer 12g, interposed therebetween. The ground conductor 68g is connected to the ground conductor 64g with three interlayer connection conductors V8g provided in the insulating base material layer 12g, interposed therebetween.

An opening AP3g is provided in the insulating base material layer 12g. The opening AP3g is disposed at the center or approximate center of the insulating base material layer 12g and is a through hole whose longitudinal direction coincides or substantially coincides with the horizontal direction (X-axis direction) and preferably having a rectangular or substantially rectangular planar shape.

The insulating base material layer 13g is a lowermost layer. On a lower surface of the insulating base material layer 13g, signal electrodes 41g and 42g, three ground electrodes 43g, three ground electrodes 44g, and five ground electrodes 45g are provided. The signal electrodes 41g and 42g and the ground electrodes 43g, 44g, and 45g are conductor patterns each preferably having a rectangular or substantially rectangular planar shape. The signal electrode 41g and the three ground electrodes 43g are located near one end (the right side end of the insulating base material layer 13g in FIG. 22B) in the longitudinal direction (X-axis direction) of the insulating base material layer 13g. The signal electrode 42g and the three ground electrodes 44g are located near the other end (the left side end of the insulating base material layer 13g) in the longitudinal direction (X-axis direction) of the insulating base material layer 13g. The five ground electrodes 45g are located at the center or approximate center in the short-side direction (Y-axis direction) of the insulating base material layer 13g and aligned in the longitudinal direction (X-axis direction).

The signal electrode 41g is connected to the signal conductor 65g with the interlayer connection conductor V9g provided in the insulating base material layer 13g, interposed therebetween. The signal electrode 42g is connected to the signal conductor 66g with the interlayer connection conductor V10g provided in the insulating base material layer 13g, interposed therebetween. The three ground electrodes 43g are connected respectively to the ground conductor 67g with three interlayer connection conductors V11g provided in the insulating base material layer 13g, interposed therebetween. The three ground electrodes 44g are respectively connected to the ground conductor 68g with three interlayer connection conductors V12g provided in the insulating base material layer 13g, interposed therebetween. The five ground electrodes 45g are respectively connected to the metal member 27A with the interlayer connection conductors V13g provided in the insulating base material layer 13g, interposed therebetween.

As described above, the base material 10G is formed preferably by stacking the insulating base material layers 11g, 12g, and 13g and heating and pressing stacked the insulating base material layers 11g, 12g, and 13g. At this time, by stacking the insulating base material layers 11g and 12g respectively including an opening AP1 (an opening AP1g to be described in detail later), an opening AP2 (an opening AP2g to be described in detail later), and an opening AP3g and the insulating base material layer 13g without an opening, a cavity is formed inside the stacked insulating base material layers 11g, 12g, and 13g. This cavity extends in the thickness direction (Z-axis direction) and the planar direction (X-axis direction or Y-axis direction) parallel or substantially parallel to principal surfaces of the insulating base material layers 11g, 12g, and 13g so as to correspond to the shape of the metal member 27A. The metal member 27A is provided (buried) in this cavity.

Figure 23A:
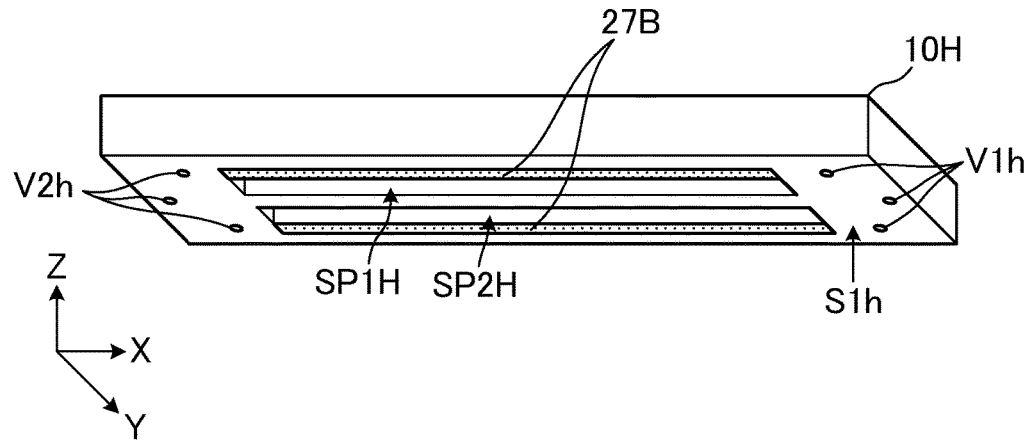
FIG. 23A is an external perspective view of a base material 10H.

Next, the structure of the base material 10H will be described. FIG. 23A is an external perspective view of the base material 10H, and FIG. 23B is an exploded perspective view of the base material 10H.

As shown in FIG. 23A, the base material 10H is a substantially elongated insulator flat plate whose longitudinal direction coincides or substantially coincides with the horizontal direction (X-axis direction), and short-side direction coincides or substantially coincides with the vertical direction (Y-axis direction). The metal member 27B is provided inside the base material 10H.

Figure 23B:
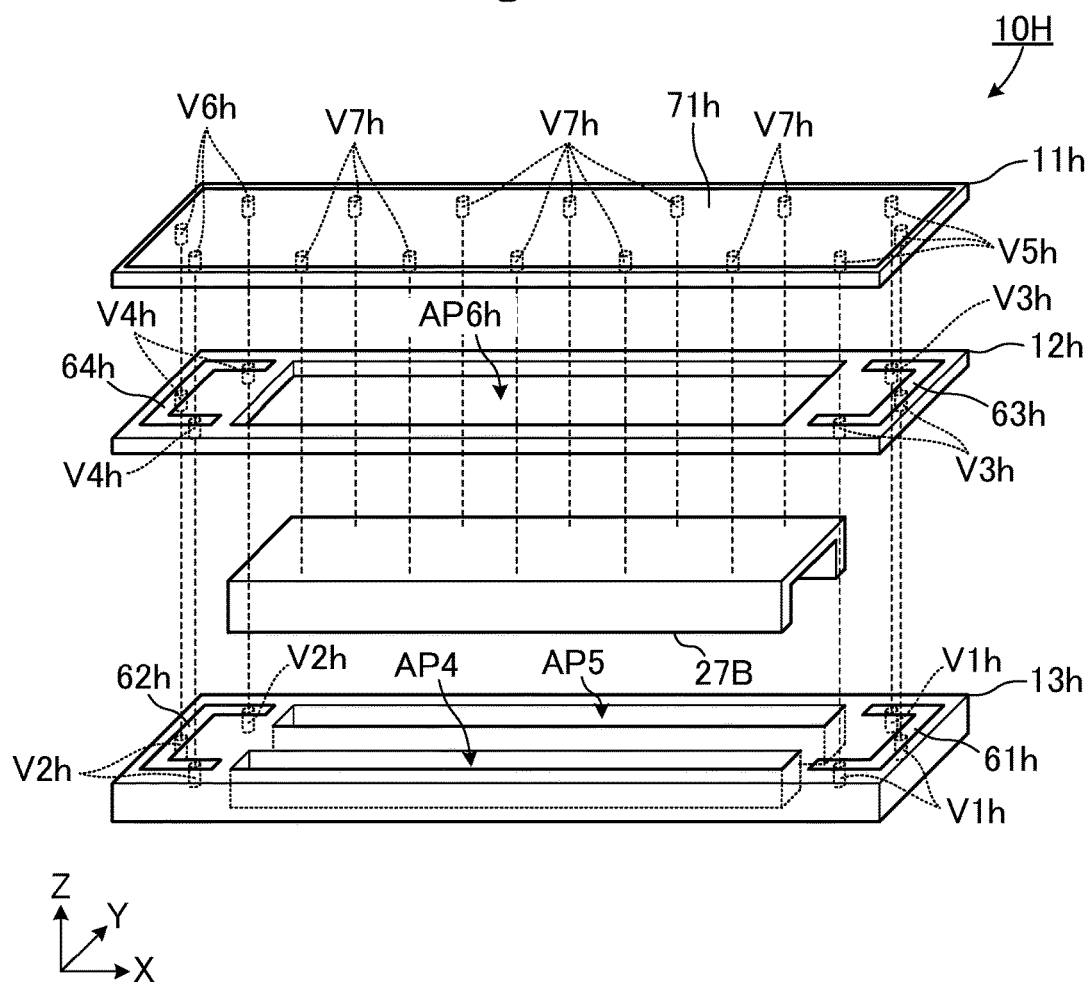
FIG. 23B is an exploded perspective view of the base material 10H.

As shown in FIG. 23B, the metal member 27B is preferably a member extending in the horizontal direction (X-axis direction) and having a C-shaped cross section and is a member in which a portion extending in the thickness direction (Z-axis direction) and a portion extending in the planar direction (Y-axis direction) are integrated. The metal member 27B is preferably obtained by, for example, shaping a copper flat plate by plastic deformation (e.g., forging).

The base material 10H includes two holes SP1H and SP2H provided from the first surface S1h towards the inside. The holes SP1H and SP2H are holes extending in the thickness direction (Z-axis direction) from the first surface S1h towards the inside of the base material 10H and extending to the metal member 27B provided inside the base material 10H. The holes SP1H and SP2H each preferably have a linear (I-shaped) planar shape extending in the horizontal direction (X-axis direction) and are aligned in the vertical direction (Y-axis direction). As shown in FIG. 23A, the holes SP1H and SP2H are provided along the metal member 27B.

The base material 10H is formed preferably by stacking insulating base material layers 11h, 12h, and 13h, each preferably made of a thermoplastic resin, for example, in the thickness direction (Z-axis direction) and heating and pressing stacked the insulating base material layers 11h, 12h, and 13h. The insulating base material layers 11h, 12h, and 13h are flat plates each preferably having a rectangular or substantially rectangular planar shape.

The insulating base material layer 11h is an uppermost layer. On an upper surface of the insulating base material layer 13h, the ground conductor 71h is provided. The ground conductor 71h is a conductor pattern provided on almost the entire surface of the insulating base material layer 11h and preferably having a rectangular or substantially rectangular planar shape. The ground conductor 71h is connected to the metal member 27B with the ten interlayer connection conductors V7h provided in the insulating base material layer 11h, interposed therebetween.

On an upper surface of the insulating base material layer 12h, the ground conductors 63h and 64h are provided. The ground conductors 63h and 64h are C-shaped conductor patterns. The ground conductor 63h is disposed near one end (the right side end of the insulating base material layer 12h in FIG. 23B) in the longitudinal direction (X-axis direction) of the insulating base material layer 12h. The ground conductor 64h is disposed near the other end (the left side end of the insulating base material layer 12h) in the longitudinal direction (X-axis direction) of the insulating base material layer 12h.

The ground conductor 63h is connected to the ground conductor 71h with three interlayer connection conductors V5h provided in the insulating base material layer 11h, interposed therebetween. The ground conductor 64h is connected to the ground conductor 71h with three interlayer connection conductors V6h provided in the insulating base material layer 11h, interposed therebetween.

An opening AP6h is provided in the insulating base material layer 12h. The opening AP6h is disposed at the center or approximate center of the insulating base material layer 12h and is a through hole whose longitudinal direction coincides or substantially coincides with the horizontal direction (X-axis direction) and preferably having a rectangular or substantially rectangular planar shape.

The insulating base material layer 13h is a lowermost layer. On an upper surface of the insulating base material layer 13h, the ground conductors 61h and 62h are provided. The ground conductors 61h and 62h are preferably C-shaped conductor patterns. The ground conductor 61h is disposed near one end (the right side end of the insulating base material layer 13h in FIG. 23B) in the longitudinal direction (X-axis direction) of the insulating base material layer 13h. The ground conductor 62h is disposed near the other end (the left side end of the insulating base material layer 13h) in the longitudinal direction (X-axis direction) of the insulating base material layer 13h.

The three interlayer connection conductors V1h and the three interlayer connection conductors V2h are provided in the insulating base material layer 13h. The three interlayer connection conductors V1h are connected to the ground conductor 61h, and the three interlayer connection conductors V2h are connected to the ground conductor 62h. The ground conductor 61h is connected to the ground conductor 63h with three interlayer connection conductors V3h provided in the insulating base material layer 12h, interposed therebetween. The ground conductor 62h is connected to the ground conductor 64h with three interlayer connection conductors V4h provided in the insulating base material layer 12h, interposed therebetween.

Openings AP4 and AP5 are provided in the insulating base material layer 13h. The opening AP4 is a through hole disposed closer to a first side (a lower side of the insulating base material layer 13h in FIG. 23B) of the insulating base material layer 13h and preferably having a linear (I-shaped) planar shape extending in the longitudinal direction (X-axis direction) of the insulating base material layer 13h. The opening AP5 is a through hole disposed closer to a second side (an upper side of the insulating base material layer 11h) of the insulating base material layer 13h and preferably having a linear (I-shaped) planar shape extending in the longitudinal direction (X-axis direction) of the insulating base material layer 13h.

As described above, the base material 10H is formed preferably by stacking the insulating base material layers 11h, 12h, and 13h and heating and pressing stacked the insulating base material layers 11h, 12h, and 13h. At this time, by stacking the insulating base material layer 11h without an opening and the insulating base material layers 12h and 13h respectively including the opening AP4 (an opening AP4h to be described in detail later), the opening AP5 (an opening AP5h to be described in detail later), and an opening AP6h, a cavity is formed inside the stacked insulating base material layers 11h, 12h, and 13h. This cavity extends in the thickness direction (Z-axis direction) and the planar direction (X-axis direction or Y-axis direction) parallel or substantially parallel to principal surfaces of the insulating base material layers 11h, 12h, and 13h so as to correspond to the shape of the metal member 27B. The metal member 27B is provided (buried) in this cavity.

By stacking the base material 10G and the base material 10H, the base material 10J (multilayer substrate 107) is provided. In the present preferred embodiment, since both of the base materials 10G and 10H are preferably made of thermoplastic resins, the base materials 10G and 10H are stacked and are able to be bonded by heating and pressing (thermocompression bonding). As shown in FIG. 20B, the holes SP1J and SP2J are provided inside the base material 10J. The hole SP1J is a hole defined by the hole SP1G provided in the base material 10G and the hole SP1H provided in the base material 10H. The hole SP2J is a hole defined by the hole SP2G provided in the base material 10G and the hole SP2H provided in the base material 10H. As shown in FIG. 20B, the holes SP1J and SP2J are provided along the metal members 27A and 27B.

In the present preferred embodiment, a transmission line in which the signal conductor 61J is surrounded by the ground (metal members 27A and 27B) is provided, and the holes SP1J and SP2J including no insulating base material layer are provided between the signal conductor 61J and the ground (metal members 27A and 27B). The holes SP1J and SP2J including no insulating base material layer are portions having a relatively lower dielectric constant than the insulating base material layer. Accordingly, with this configuration, the capacitance generated between the signal conductor 61J and the ground (metal members 27A and 27 B) is able to be reduced. In addition, with this configuration, dielectric loss occurring when a high-frequency signal is transmitted to the signal conductor 61J is reduced or prevented.

The base material 10G according to the present preferred embodiment is preferably manufactured by, for example, the following non-limiting process.

Figure 24:
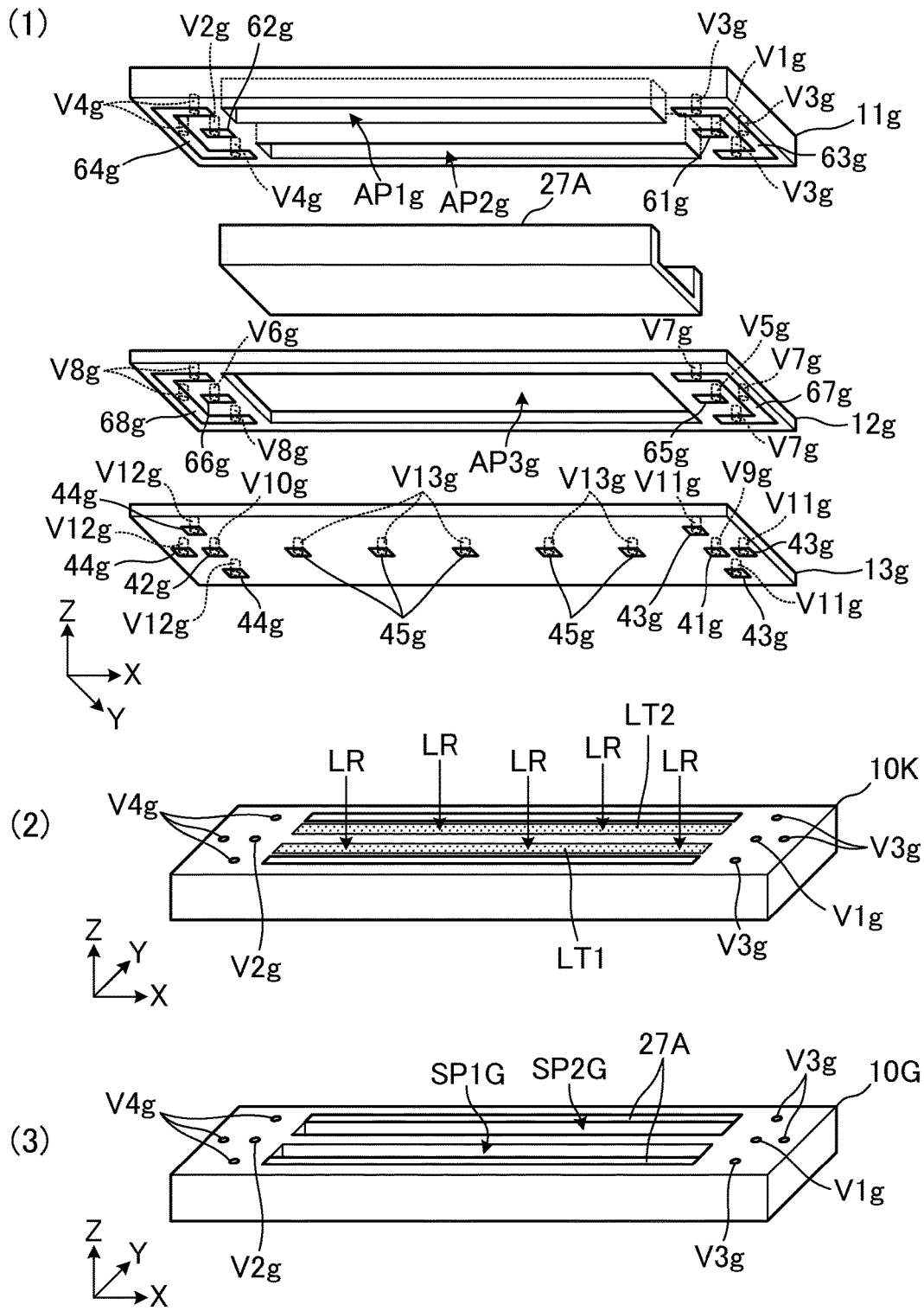
FIG. 24 is a perspective view sequentially showing a process of manufacturing the base material 10G.

FIG. 24 is a perspective view sequentially showing a process of manufacturing the base material 10G. In FIG. 24, for the sake of convenience of explanation, although explanation will be provided in a manufacturing process with individual pieces, the actual process of manufacturing the base material is performed in the collective substrate state. In FIG. 24, in order to make the structure easy to understand, regions LT1 and LT2 are indicated by dot patterns.

First, as shown in (1) in FIG. 24, a metal foil (for example, a copper foil) is laminated on one of the principal surfaces of the insulating base material layers 11g, 12g, and 13g, and the metal foil is patterned by photolithography. Consequently, conductor patterns (signal conductors 61g, 62g, 65g, and 66g, signal electrodes 41g and 42g, ground conductors 63g, 64g, 67g, and 68g, and ground electrodes 43g, 44g, and 45g) are formed respectively on the insulating base material layers 11g, 12g, and 13g. For the insulating base material layers 11g, 12g, and 13g, for example, a thermoplastic resin sheet, such as a liquid crystal polymer, is preferably used.

The interlayer connection conductors V1g, V2g, V3g, V4g, V5g, V6g, V7g, V8g, V9g, V10g, V11g, V12g, and V13g are formed respectively in the insulating base material layers 11g, 12g, and 13g. The interlayer connection conductors V1g, V2g, V3g, V4g, V5g, V6g, V7g, V8g, V9g, V10g, V11g, V12g, and V13g are provided by forming a through hole with a laser or other suitable method, then filling a conductive paste preferably including one or more of Cu, Ag, Sn, Ni, and Mo or an alloy thereof, and solidifying the conductive paste through the subsequent heating and pressing step. Thus, the interlayer connection conductors V1g, V2g, V3g, V4g, V5g, V6g, V7g, V8g, V9g, V10g, V11g, V12g, and V13g are each preferably made of a material having a melting point lower than the temperature at the time of the subsequent heating and pressing.

On the other hand, the openings AP1g, AP2g, and AP3g defining a cavity inside the stacked insulating base material layers 11g, 12g, and 13g are formed respectively in the insulating base material layers 11g and 12g.

Then, the metal member 27A is formed to have a shape which includes a portion extending in a thickness direction (Z-axis direction) and a portion extending in a planar direction (X-axis direction or Y-axis direction). The metal member 27A is formed to have a three-dimensional structure preferably by, for example, shaping a copper flat plate by plastic deformation (e.g., forging).

Thereafter, the insulating base material layers 11g, 12g, and 13g are stacked, the shaped metal member 27A is disposed inside the cavity (openings AP1g, AP2g, and AP3g), and the stacked insulating base material layers 11g, 12g, and 13g are heated and pressed, thus forming a base material 10K.

Then, as shown in (2) in FIG. 24, the holes SP1G and SP2G extending in the thickness direction (Z-axis direction) from the first surface S1g towards the inside of the base material 10K are formed to obtain the base material 10G shown in (3) in FIG. 24.

Specifically, the hole SP1G is formed preferably by radiating a laser beam LR toward the thickness direction (Z-axis direction) with respect to the region LT1 of the first surface S1g of the base material 10K. The hole SP2G is formed preferably by radiating the laser beam LR toward the thickness direction (Z-axis direction) with respect to the region LT2 of the first surface S1g of the base material 10K. The laser beam LR is shielded by the metal member 27A disposed inside the base material. Accordingly, by using such a manufacturing method, it is possible to easily form the holes SP1G and SP2G (extending from the first surface S1g to the metal member 27A) along the metal member 27A.

The base material 10H according to the present preferred embodiment is preferably manufactured by, for example, the following non-limiting process.

Figure 25:
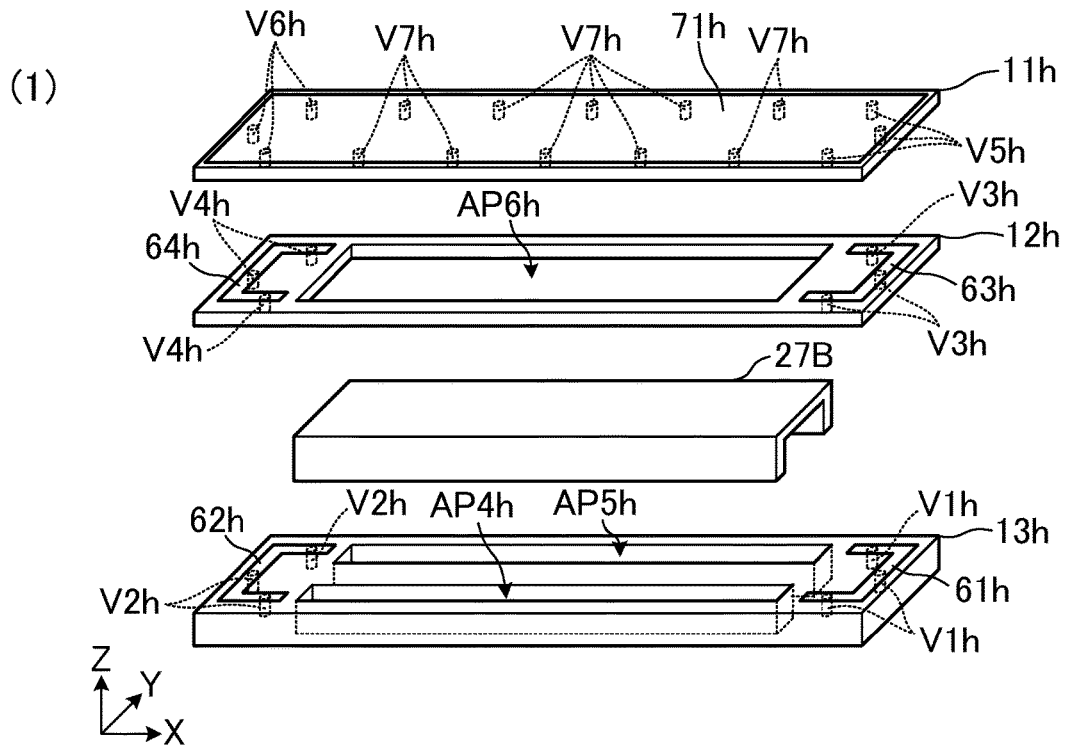
FIG. 25 is a perspective view sequentially showing a process of manufacturing the base material 10H.
Figure 25:
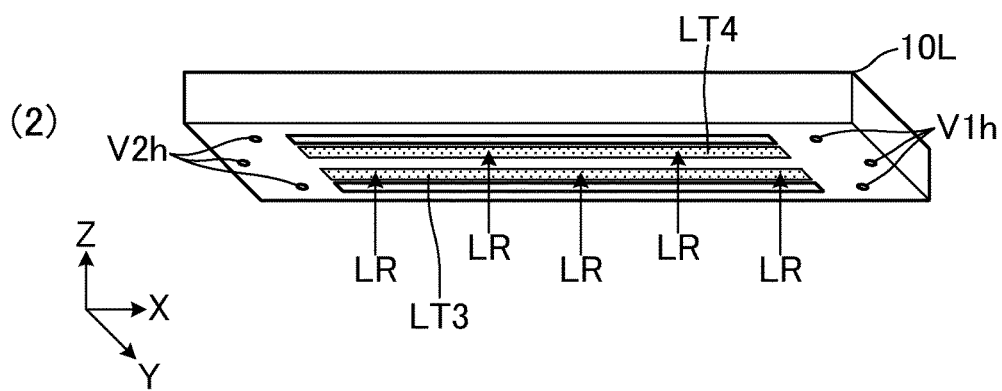
Figure 25:
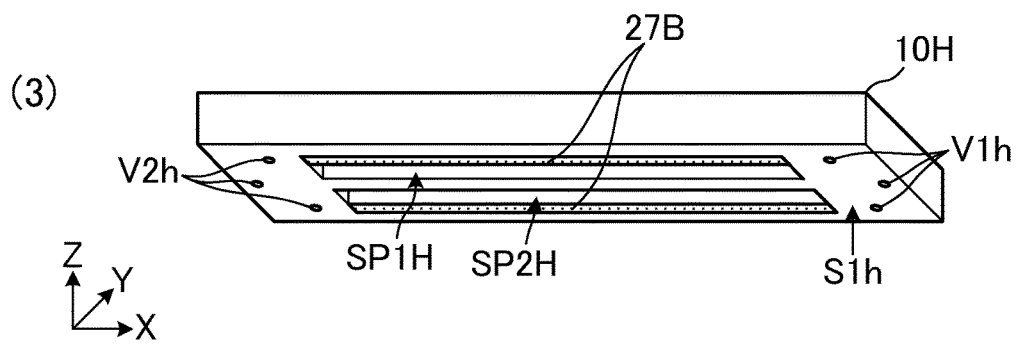

FIG. 25 is a perspective view sequentially showing a process of manufacturing the base material 10H. In FIG. 25, for the sake of convenience of explanation, although explanation will be provided in a manufacturing process with individual pieces, the actual process of manufacturing the base material is performed in the collective substrate state. In FIG. 25, in order to make the structure easy to understand, the regions LT3 and LT4 are indicated by dot patterns.

First, as shown in (1) in FIG. 25, a metal foil (for example, a copper foil) is laminated on one of the principal surfaces of the insulating base material layers 11h, 12h, and 13h, and the metal foil is patterned by photolithography. Consequently, conductor patterns (ground conductors 61h, 62h, 63h, 64h, and 71h) are formed respectively on the insulating base material layers 11h, 12h, and 13h. For the insulating base material layers 11h, 12h, and 13h, for example, a thermoplastic resin sheet, such as a liquid crystal polymer, is preferably used.

Further, the interlayer connection conductors V1h, V2h, V3h, V4h, V5h, V6h, and V7h are formed respectively in the insulating base material layers 11h, 12h, and 13h. The interlayer connection conductors V1h, V2h, V3h, V4h, V5h, V6h, and V7h are provided by forming a through hole with a laser or other suitable method, then filling a conductive paste preferably including one or more of Cu, Ag, Sn, Ni, and Mo or an alloy thereof, and solidifying the conductive paste through the subsequent heating and pressing step. Thus, the interlayer connection conductors V1h, V2h, V3h, V4h, V5h, V6h, and V7h are each preferably made of a material having a melting point lower than the temperature at the time of the subsequent heating and pressing.

The openings AP4h, AP5h, and AP6h defining a cavity inside the stacked insulating base material layers 11h, 12h, and 13h are formed respectively in the insulating base material layers 12h and 13h.

Then, the metal member 27B is formed to have a shape which includes a portion extending in a thickness direction (Z-axis direction) and a portion extending in a planar direction (X-axis direction or Y-axis direction). The metal member 27B is formed to have a three-dimensional structure preferably by, for example, shaping a copper flat plate by plastic deformation (e.g., forging).

Thereafter, the insulating base material layers 11h, 12h, and 13h are stacked, the shaped metal member 27B is disposed inside the cavity (openings AP4h, AP5h, and AP6h), and the stacked insulating base material layers 11h, 12h, and 13h are heated and pressed, thus forming a base material 10L.

Then, as shown in (2) in FIG. 25, the holes SP1H and SP2H extending in the thickness direction (Z-axis direction) from the first surface S1h towards the inside of the base material 10L are formed to obtain the base material 10H shown in (3) in FIG. 25.

Specifically, the hole SP1H is preferably formed by radiating the laser beam LR toward the thickness direction (Z-axis direction) with respect to a region LT3 of the first surface S1h of the base material 10L. The hole SP2H is preferably formed by radiating the laser beam LR toward the thickness direction (Z-axis direction) with respect to the region LT4 of the first surface S1h of the base material 10L. The laser beam LR is shielded by the metal member 27B disposed inside the base material. Accordingly, with a manufacturing method, it is possible to easily form the holes SP1H and SP2H (extending from the first surface S1h to the metal member 27B) along the metal member 27B.

Other Preferred Embodiments

In the above preferred embodiments, although the base material preferably is a substantially elongated insulator flat plate whose longitudinal direction coincides or substantially coincides with the horizontal direction (X-axis direction), and short-side direction coincides or substantially coincides with the vertical direction (Y-axis direction), the present invention is not limited to this configuration. The shape, structure, and other configurations of the base material may be appropriately changed within the scope of producing the operational and advantageous effects of the present invention. The planar shape of the base material may be appropriately changed to, for example, a square shape, a circular shape, an elliptical shape, an L-shape, or a Y-shape.

In the above first to sixth preferred embodiments, although examples of multilayer substrates each preferably including a base material in which the number of stacked insulating base material layers is four or five is shown, the present invention is not limited to this configuration. The number of stacked insulating base material layers in the base material (multilayer substrate) may be appropriately changed within the scope of producing the operational advantageous effects of the present invention.

The configuration of the circuit included in the multilayer substrate is not limited to only the configuration described in the above preferred embodiments. The circuit configuration of the multilayer substrate may be appropriately changed within the scope of producing the operational effects of the present invention. Accordingly, the shape, number, size, and other parameters of the conductor pattern and the interlayer connection conductor provided at the insulating base material layers may be appropriately changed depending on the circuit configuration of the multilayer substrate. In addition, the type, the number, and other parameters of the mounting components 31 and 32 may be appropriately changed depending on the circuit configuration of the multilayer substrate. In the above preferred embodiments, although the mounting components 31 and 32 are mounted on the first principal surface VS1 of the base material 10, the present invention is not limited to this configuration. The mounting components 31 and 32 may be mounted on the second principal surface VS2 of the base material 10. Further, the mounting components 31 and 32 may be provided (buried) inside the base material 10. In the multilayer substrate of the present invention, the mounting components 31 and 32 are not required.

In addition, the type, the number, and other parameters of the connector 51 may be appropriately changed depending on the circuit configuration of the multilayer substrate. In the above preferred embodiments, although the connector 51 preferably is mounted on the first principal surface VS1 of the base material 10, the present invention is not limited to this configuration. The connector 51 may be mounted on the second principal surface VS2 of the base material 10. In the multilayer substrate of the present invention, the connector 51 is not required. That is, the multilayer substrate may be connected to another circuit board with a conductive bonding material, such as solder, interposed therebetween.

The shape (three-dimensional structure) of the metal member is not limited to the structures of the metal members 21, 22, and 24 shown in the above preferred embodiments. The shape (three-dimensional structure) of the metal member may be appropriately changed as long as it includes a portion extending in at least a thickness direction (Z-axis direction) and a portion extending in a planar direction (X-axis direction or Y-axis direction) and defines at least a portion of a circuit provided in in contact with a base material. The cross-sectional shape of the metal member does not necessarily have to be circular or substantially circular. The cross-sectional shape of the metal member may be appropriately changed to, for example, a rectangular shape, a square shape, a polygonal shape, an elliptical shape, an L-shape, a T-shape, or a U-shape (C-shape).

In the first and second preferred embodiments, although the metal members 21 and 22 preferably are, for example, radiating elements of UHF band antennas, the present invention is not limited to this configuration. The metal member may define a portion of a transmission line, a coil antenna, an inductor, or other electronic components.

In the first and second preferred embodiments, although one end of each of the metal members 21 and 22 preferably is connected to the conductor pattern (the other end of the conductor 61) with the conductive bonding material 1 interposed therebetween, the present invention is not limited to this configuration. The conductive bonding material 1 is not required and may be connected by abutting one end of the metal member against the conductor pattern (the other end of the conductor 61).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a base in which a plurality of insulating base material layers made of a thermoplastic resin are stacked;
    a conductor pattern provided on at least one of the plurality of insulating base material layers; and
    a metal member connected to the conductor pattern; wherein the metal member includes a bent portion provided inside the base;
the metal member includes a portion extending in at least a stacking direction of the plurality of insulating base material layers and a portion extending in a planar direction parallel or substantially parallel to a principal surface of the plurality of insulating base material layers with the bent portion interposed therebetween;
the metal member defines at least a portion of a circuit in contact with the base; and
a portion of the metal member extends in a direction that is greater than 0° and less than 90° with respect to the stacking direction.

2. A multilayer substrate comprising:
a base in which a plurality of insulating base material layers made of a thermoplastic resin are stacked;
a conductor pattern provided on at least one of the plurality of insulating base material layers; and
a metal member connected to the conductor pattern; wherein
the metal member includes a bent portion provided inside the base;
the metal member includes a portion extending in at least a stacking direction of the plurality of insulating base material layers and a portion extending in a planar direction parallel or substantially parallel to a principal surface of the plurality of insulating base material layers with the bent portion interposed therebetween;
the metal member defines at least a portion of a circuit in contact with the base; and
the metal member is at least a portion of a radiating element of an antenna.

3. The multilayer substrate according to claim 2, wherein at least a portion of the metal member provided inside the base is disposed in a cavity provided inside the stacked insulating base material layers and extending in the stacking direction and in the planar direction parallel or substantially parallel to the principal surface of the plurality of insulating base material layers so as to correspond to a shape of the metal member.

4. The multilayer substrate according to claim 2, wherein a thickness of the metal member in the stacking direction is larger than a thickness of the conductor pattern in the stacking direction.

5. The multilayer substrate according to claim 2, further comprising:
an interlayer connection conductor provided in at least one of the plurality of insulating base material layers, extending in the stacking direction, and connected to the conductor pattern; wherein
the interlayer connection conductor and the conductor pattern are solid phase diffusion bonded to each other.

6. The multilayer substrate according to claim 2, wherein the metal member is made of a same material as the conductor pattern.

7. A multilayer substrate comprising:
a base in which a plurality of insulating base material layers made of a thermoplastic resin are stacked;
a conductor pattern provided on at least one of the plurality of insulating base material layers; and
a metal member connected to the conductor pattern; wherein
the metal member includes a bent portion provided inside the base;
the metal member includes a portion extending in at least a stacking direction of the plurality of insulating base material layers and a portion extending in a planar direction parallel or substantially parallel to a principal surface of the plurality of insulating base material layers with the bent portion interposed therebetween;
the metal member defines at least a portion of a circuit in contact with the base;
the conductor pattern includes a signal conductor;
the metal member surrounds at least three directions of the signal conductor; and
a transmission line including the metal member and the signal conductor is provided.

8. A multilayer substrate comprising:
a base in which a plurality of insulating base material layers made of a thermoplastic resin are stacked;
a conductor pattern provided on at least one of the plurality of insulating base material layers; and
a metal member connected to the conductor pattern; wherein
the metal member includes a bent portion provided inside the base;
the metal member includes a portion extending in at least a stacking direction of the plurality of insulating base material layers and a portion extending in a planar direction parallel or substantially parallel to a principal surface of the plurality of insulating base material layers with the bent portion interposed therebetween;
the metal member defines at least a portion of a circuit in contact with the base; and
the base includes a hole provided along the metal member.

9. The multilayer substrate according to claim 8, wherein at least a portion of the metal member provided inside the base is disposed in a cavity provided inside the stacked insulating base material layers and extending in the stacking direction and in the planar direction parallel or substantially parallel to the principal surface of the plurality of insulating base material layers so as to correspond to a shape of the metal member.

10. The multilayer substrate according to claim 8, wherein a thickness of the metal member in the stacking direction is larger than a thickness of the conductor pattern in the stacking direction.

11. The multilayer substrate according to claim 8, further comprising:
an interlayer connection conductor provided in at least one of the plurality of insulating base material layers, extending in the stacking direction, and connected to the conductor pattern; wherein
the interlayer connection conductor and the conductor pattern are solid phase diffusion bonded to each other.

12. The multilayer substrate according to claim 8, wherein the metal member is made of a same material as the conductor pattern.

13. An electronic device comprising:
a housing; and
a multilayer substrate provided inside the housing; wherein
the multilayer substrate includes:
a base in which a plurality of insulating base material layers made of a thermoplastic resin are stacked;
a conductor pattern provided on at least one of the plurality of insulating base material layers; and
a metal member connected to the conductor pattern;
the metal member includes a bent portion that provided inside the base;
the metal member includes a portion extending in at least a stacking direction of the plurality of insulating base material layers and a portion extending in a planar direction parallel or substantially parallel to a principal surface of the plurality of insulating base material layers with the bent portion interposed therebetween;

the metal member defines at least a portion of a circuit in contact with the base; and a portion of the metal member extends in a direction that is greater than 0° and less than 90° with respect to the stacking direction.

14. An electronic device comprising:

a housing; and a multilayer substrate provided inside the housing; wherein the multilayer substrate includes:
- a base in which a plurality of insulating base material layers made of a thermoplastic resin are stacked;
- a conductor pattern provided on at least one of the plurality of insulating base material layers; and
- a metal member connected to the conductor pattern;

the metal member includes a bent portion that provided inside the base;

the metal member includes a portion extending in at least a stacking direction of the plurality of insulating base material layers and a portion extending in a planar direction parallel or substantially parallel to a principal surface of the plurality of insulating base material layers with the bent portion interposed therebetween;

the metal member defines at least a portion of a circuit in contact with the base;

the conductor pattern includes a signal conductor;

the metal member surrounds at least three directions of the signal conductor; and a transmission line including the metal member and the signal conductor is provided.

15. An electronic device comprising:

a housing; and a multilayer substrate provided inside the housing; wherein the multilayer substrate includes:
- a base in which a plurality of insulating base material layers made of a thermoplastic resin are stacked;
- a conductor pattern provided on at least one of the plurality of insulating base material layers; and
- a metal member connected to the conductor pattern;

the metal member includes a bent portion that provided inside the base;

the metal member includes a portion extending in at least a stacking direction of the plurality of insulating base material layers and a portion extending in a planar direction parallel or substantially parallel to a principal surface of the plurality of insulating base material layers with the bent portion interposed therebetween;

the metal member defines at least a portion of a circuit in contact with the base; and the metal member is at least a portion of a radiating element of an antenna.

16. The electronic device according to claim 15, further comprising:

a mounting substrate provided inside the housing; wherein the multilayer substrate is mounted on the mounting substrate.

17. An electronic device comprising:

a housing; and a multilayer substrate provided inside the housing; wherein the multilayer substrate includes:
- a base in which a plurality of insulating base material layers made of a thermoplastic resin are stacked;
- a conductor pattern provided on at least one of the plurality of insulating base material layers; and
- a metal member connected to the conductor pattern;

the metal member includes a bent portion that provided inside the base;

the metal member includes a portion extending in at least a stacking direction of the plurality of insulating base material layers and a portion extending in a planar direction parallel or substantially parallel to a principal surface of the plurality of insulating base material layers with the bent portion interposed therebetween;

the metal member defines at least a portion of a circuit in contact with the base; and the base includes a hole provided along the metal member.

18. The electronic device according to claim 17, further comprising:

a mounting substrate provided inside the housing; wherein the multilayer substrate is mounted on the mounting substrate.

* * * * *